United States Patent
Kim et al.

(10) Patent No.: US 10,891,204 B2
(45) Date of Patent: Jan. 12, 2021

(54) MEMORY SYSTEM, A METHOD OF DETERMINING AN ERROR OF THE MEMORY SYSTEM AND AN ELECTRONIC APPARATUS HAVING THE MEMORY SYSTEM

(71) Applicant: SAMSUNG ELECTRONICS CO., LTD., Suwon-si (KR)

(72) Inventors: Soo-Hyung Kim, Hwaseong-si (KR); Chul-Hwan Choo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 16/200,948

(22) Filed: Nov. 27, 2018

(65) Prior Publication Data

US 2019/0235977 A1    Aug. 1, 2019

(51) Int. Cl.
G06F 11/00 (2006.01)
G06F 11/20 (2006.01)
G06F 11/07 (2006.01)
G06F 12/00 (2006.01)

(52) U.S. Cl.
CPC .......... *G06F 11/201* (2013.01); *G06F 11/073* (2013.01); *G06F 11/0751* (2013.01); *G06F 12/00* (2013.01); *G06F 2201/805* (2013.01)

(58) Field of Classification Search
CPC ... G06F 11/201; G06F 11/073; G06F 11/0751
See application file for complete search history.

(56) References Cited

U.S. PATENT DOCUMENTS

| | | |
|---|---|---|
| 8,421,500 B2 | 4/2013 | Barowski et al. |
| 8,873,320 B2 | 10/2014 | Goel et al. |
| 9,100,006 B2 | 8/2015 | Chi |
| 9,182,925 B2 | 11/2015 | Thayer |
| 9,294,092 B2 | 3/2016 | Hutton |
| 9,389,945 B1 | 7/2016 | Press et al. |
| 2013/0047046 A1 | 2/2013 | Goel |
| 2013/0159587 A1 | 6/2013 | Nygren et al. |
| 2014/0223239 A1* | 8/2014 | Mittal ............ G06F 11/0781 714/42 |
| 2016/0047046 A1 | 2/2016 | Matsui et al. |
| 2016/0078930 A1* | 3/2016 | Yoon ............... G11C 11/5678 365/163 |
| 2017/0278560 A1* | 9/2017 | Shin ................ G11C 11/406 |

* cited by examiner

*Primary Examiner* — Katherine Lin
(74) *Attorney, Agent, or Firm* — F. Chau & Associates, LLC

(57) ABSTRACT

A memory system including: a memory apparatus including a buffer die, core dies disposed on the buffer die, channels and a through silicon via configured to transmit a signal between the buffer die and at least one of the core dies; a memory controller configured to output a command signal and an address signal to the memory apparatus, to output a data signal to the memory apparatus and to receive the data signal from the memory apparatus; and an interposer including channel paths for connecting the memory controller and the channels, wherein the memory apparatus further includes a path selector for changing a connection state between the channels and channel paths, and when an error is detected in a first connection state between the channels and the channel paths, the path selector changes the first connection state to a second connection state.

19 Claims, 20 Drawing Sheets

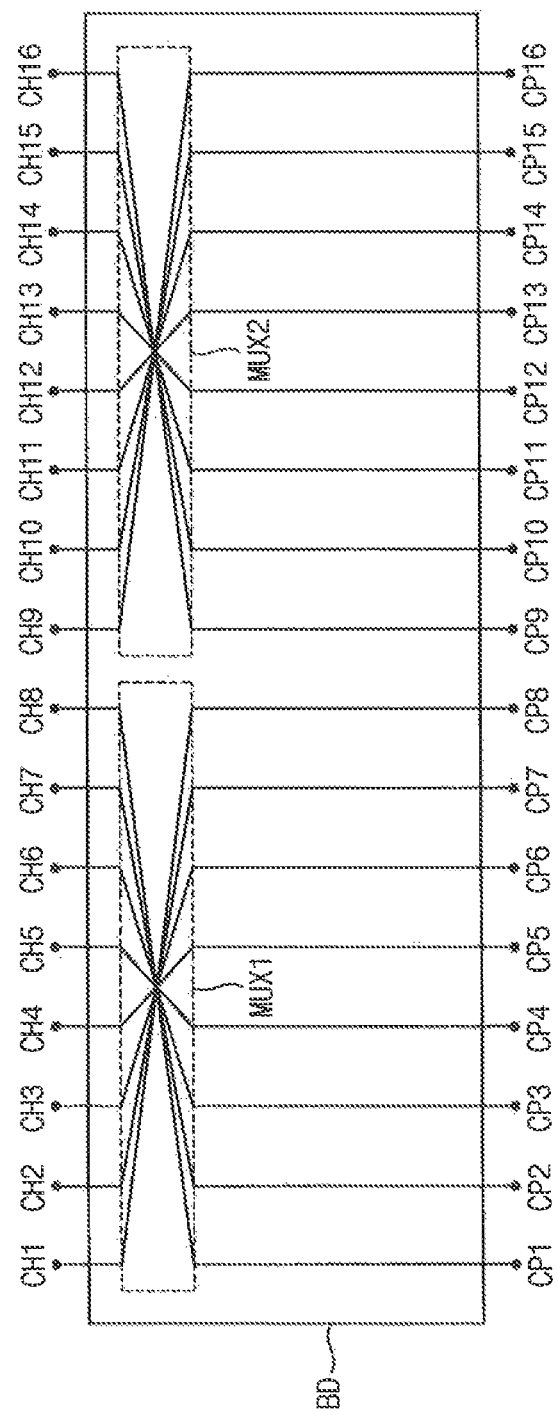
F I G. 9B

MEMORY SYSTEM, A METHOD OF DETERMINING AN ERROR OF THE MEMORY SYSTEM AND AN ELECTRONIC APPARATUS HAVING THE MEMORY SYSTEM

CROSS-REFERENCE TO RELATED APPLICATION

This application claims priority under 35 U.S.C. § 119 to Korean Patent Application No. 10-2018-0012200, filed on Jan. 31, 2018 in the Korean Intellectual Property Office (KIPO), the disclosure of which is incorporated by reference herein in its entirety.

1. TECHNICAL FIELD

Exemplary embodiments of the present inventive concept relate to a memory system, a method of determining an error of the memory system and an electronic apparatus including the memory system.

2. DESCRIPTION OF THE RELATED ART

Generally, a high bandwidth memory (HBM) includes a multi-channel memory and a channel path connecting the multi-channel memory and a memory controller.

When an error occurs in a memory system including the multi-channel memory, the location of where the error occurred may not be easily determined. For example, the error may occur in the memory system or in the channel path connecting the multi-channel memory and the memory controller.

In addition, when the memory system is transmitted to an independent error determining system instead of a real workload system to detect the error, the error is not reproduced, and thus, a location of the error may not be determined.

SUMMARY

In an exemplary embodiment of a memory system according to the present inventive concept, the memory system includes a memory apparatus including a buffer die, a plurality of core dies disposed on the buffer die, a plurality of channels and a through silicon via configured to transmit a signal between the buffer die and at least one of the core dies; a memory controller configured to output a command signal and an address signal to the memory apparatus, to output a data signal to the memory apparatus and to receive the data signal from the memory apparatus; and an interposer including a plurality of channel paths for connecting the memory controller and the channels, wherein the memory apparatus further includes a path selector for changing a connection state between the channels and channel paths, and wherein when an error of the memory system is detected in a first connection state between the channels and the channel paths, the path selector changes the first connection state to a second connection state between the channels and the channel paths.

In an exemplary embodiment of a method of determining an error of a memory system according to the present inventive concept, the method includes detecting an error of the memory system in a first connection state between a plurality of channels of a memory apparatus and a plurality of channel paths connecting the channels to a memory controller, the memory apparatus including a buffer die, a plurality of core dies disposed on the buffer die and a through silicon via configured to transmit a signal between at least one of the core dies and the buffer die; changing a connection state between the channels and the channel paths from the first connection state to a second connection state when the error of the memory system is detected; and detecting the error of the memory system in the second connection state.

In an exemplary embodiment of an electronic apparatus according to the present inventive concept, the electronic apparatus includes an application processor; and a memory system configured to be operated by the application processor, wherein the memory system includes: a memory apparatus including a buffer die, a plurality of core dies disposed on the buffer die, a plurality of channels and a through silicon via configured to transmit a signal between at least one of the core dies and the buffer die; a memory controller configured to output a command signal and an address signal to the memory apparatus, to output a data signal to the memory apparatus and to receive the data signal from the memory apparatus; and an interposer including a plurality of channel paths for connecting the memory controller and the channels, wherein the memory apparatus further includes a path selector for changing a connection state between the channels and channel paths, and wherein when an error of the memory system is detected in a first connection state between the channels and the channel paths, the path selector changes from the first connection state to a second connection state.

BRIEF DESCRIPTION OF THE DRAWINGS

The above and other features of the present inventive concept will become more apparent by describing in detail exemplary embodiments thereof with reference to the accompanying drawings, in which:

FIG. 9B is a diagram illustrating a second connection status of the path selectors disposed on the buffer die of FIG. 2, according to an exemplary embodiment of the present inventive concept;

DETAILED DESCRIPTION OF THE EMBODIMENTS

Figure 1:
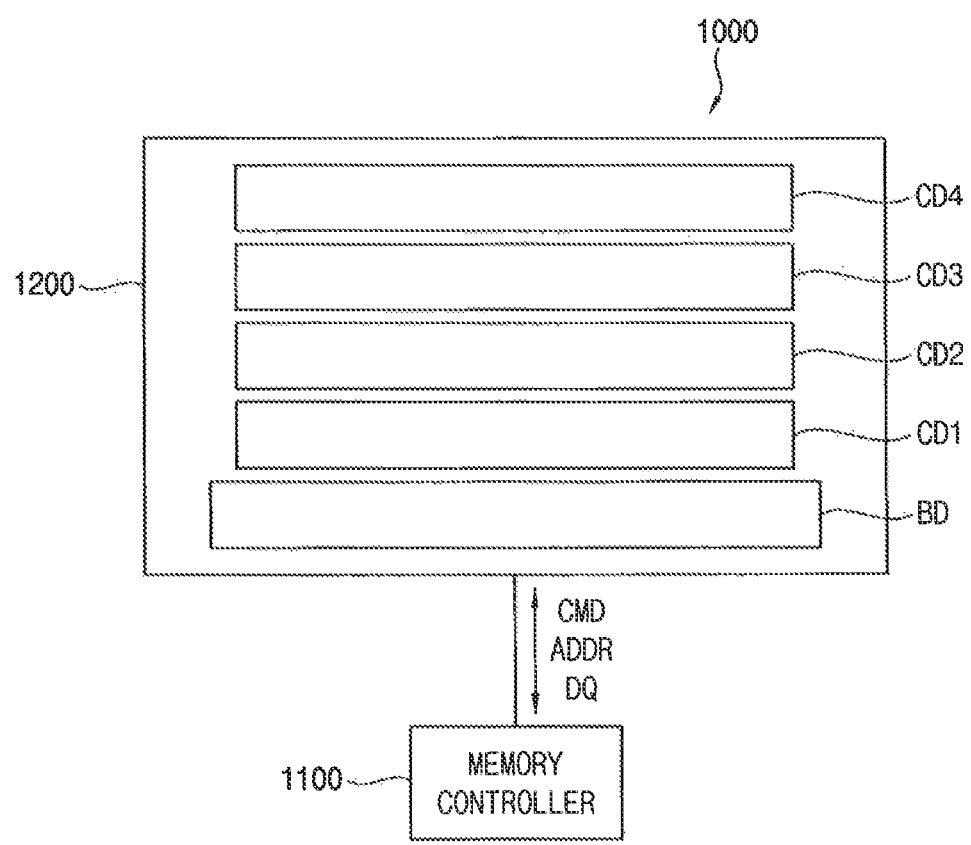
FIG. 1 is a block diagram illustrating a memory system according to an exemplary embodiment of the present inventive concept.

Exemplary embodiments of the present inventive concept will be described more fully hereinafter with reference to the accompanying drawings. The present inventive concept may, however, be embodied in many different forms and should not be construed as limited to the embodiments set forth herein. Like reference numerals may refer to like elements throughout this application.

Figure 2:
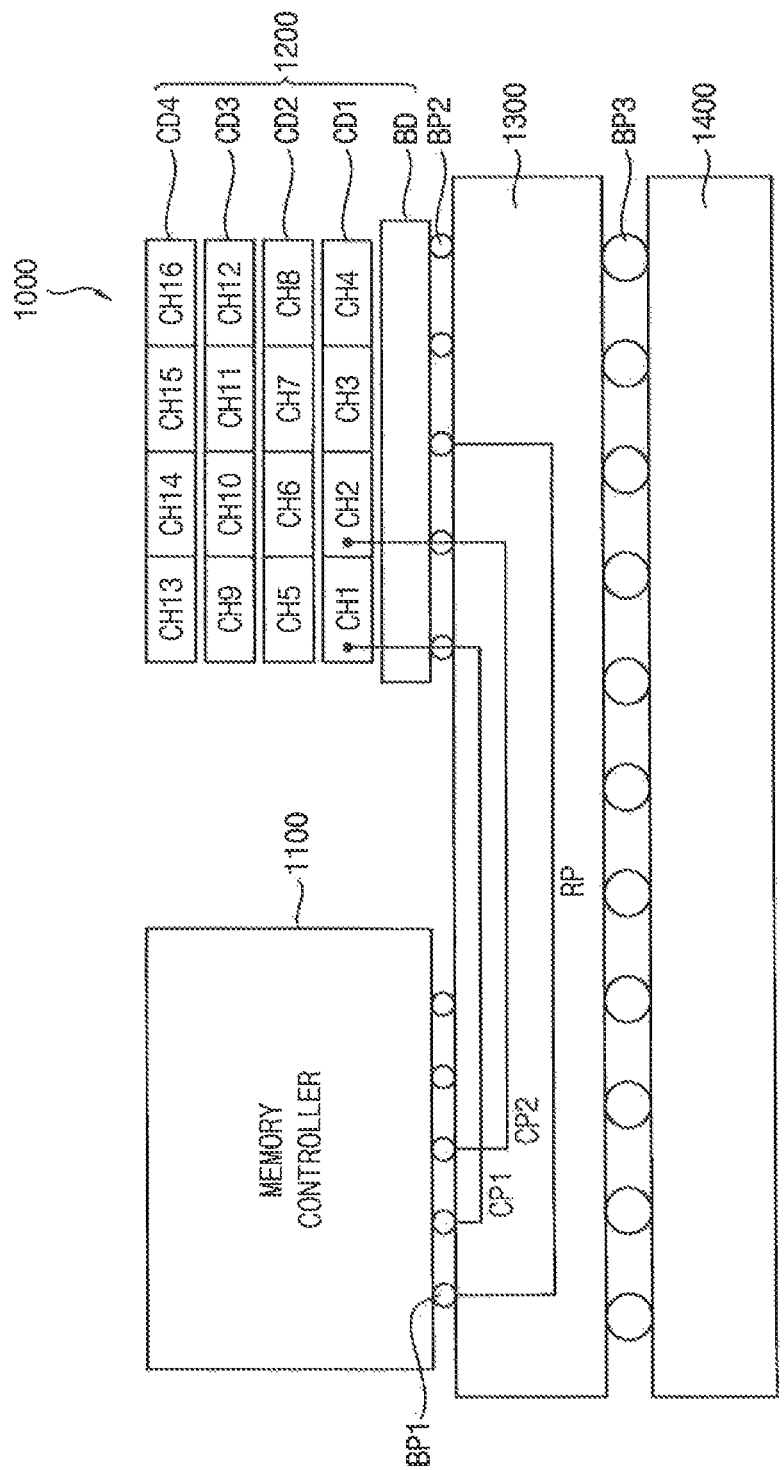
FIG. 2 is a diagram illustrating the memory system of FIG. 1, according to an exemplary embodiment of the present inventive concept.

FIG. 1 is a block diagram illustrating a memory system 1000 according to an exemplary embodiment of the present inventive concept. FIG. 2 is a diagram illustrating the memory system 1000 of FIG. 1, according to an exemplary embodiment of the present inventive concept.

Referring to FIGS. 1 and 2, the memory system 1000 includes a memory controller 1100 and a memory apparatus 1200. The memory system 1000 may further include an interposer 1300 disposed between the memory controller 1100 and the memory apparatus 1200. The memory controller 1100 and the memory apparatus 1200 may be disposed on the interposer 1300. For example, the interposer 1300 may be a silicon interposer. For example, the memory controller 1100 and the memory apparatus 1200 may be disposed on a same plane. The memory system 1000 may further include a package substrate 1400. The interposer 1300 may be disposed on the package substrate 1400.

First bumps BP1 may be disposed between the interposer 1300 and the memory controller 1100. Second bumps BP2 may be disposed between the interposer 1300 and the memory apparatus 1200. Third bumps BP3 may be disposed between the package substrate 1400 and the interposer 1300. A size of the third bumps BP3 may greater than a size of each of the first and second bumps BP1 and BP2.

The memory apparatus 1200 may include a buffer die BD and at least one core die (e.g. CD1, CD2, CD3 and CD4) disposed on the buffer die BD.

The buffer die BD may include a plurality of buffers. The buffers are connected to channel paths CP1, CP2, CP3, CP4, CP5, CP6, CP7, CP8, CP9, CP10, CP11, CP12, CP13, CP14, CP15 and CP16 and output data signals DQ transmitted through the channel paths CP1 to CP16 to channels CH1, CH2, CH3, CH4, CH5, CH6, CH7, CH8, CH9, CH10, CH11, CH12, CH13, CH14, CH15 and CH16.

The memory apparatus 1200 may include the channels CH1 to CH16. For example, a first core die CD1 disposed on the buffer die BD may include first to fourth channels CH1 to CH4. For example, a second core die CD2 disposed on the first core die CD1 may include fifth to eighth channels CH5 to CH8. For example, a third core die CD3 disposed on the second core die CD2 may include ninth to twelfth channels CH9 to CH12. For example, a fourth core die CD4 disposed on the third core die CD3 may include thirteenth to sixteenth channels CH13 to CH16. For example, the memory apparatus 1200 may be a dynamic random access memory (DRAM) apparatus.

A signal may be transmitted between the buffer die BD and the core dies CD1 to CD4 through a through silicon via.

The interposer 1300 may include the channel paths CP1 to CP16 connecting the channels CH1 to CH16 of the memory apparatus 1200 and the memory controller 1100. The channels CH1 to CH16 of the memory apparatus 1200 may be connected to the memory controller 1100 through the channel paths CP1 to CP16. Although FIG. 2 only shows two channel paths CP1 and CP2 for clarity, it is to be understood that the remaining channel paths CP3 to CP16 are similarly connected to the first bumps BP1 of the memory controller 1100. The interposer 1300 may further include at least one repair channel path RP connecting the channels CH1 to CH16 of the memory apparatus 1200 and the memory controller 1100. When an error occurs at one of the channel paths CP1 to CP16, the memory controller 1100 may communicate with the channels CH1 to CH16 of the memory apparatus 1200 through the repair channel path RP.

The memory controller 1100 may output a command signal CMD and an address signal ADDR to the memory apparatus 1200 through the channel paths CP1 to CP16. The memory controller 1100 may output the data signal DQ to the memory apparatus 1200 through the channel paths CP1 to CP16 and receive the data signal DQ from the memory apparatus 1200 through the channel paths CP1 to CP16.

Figure 3:
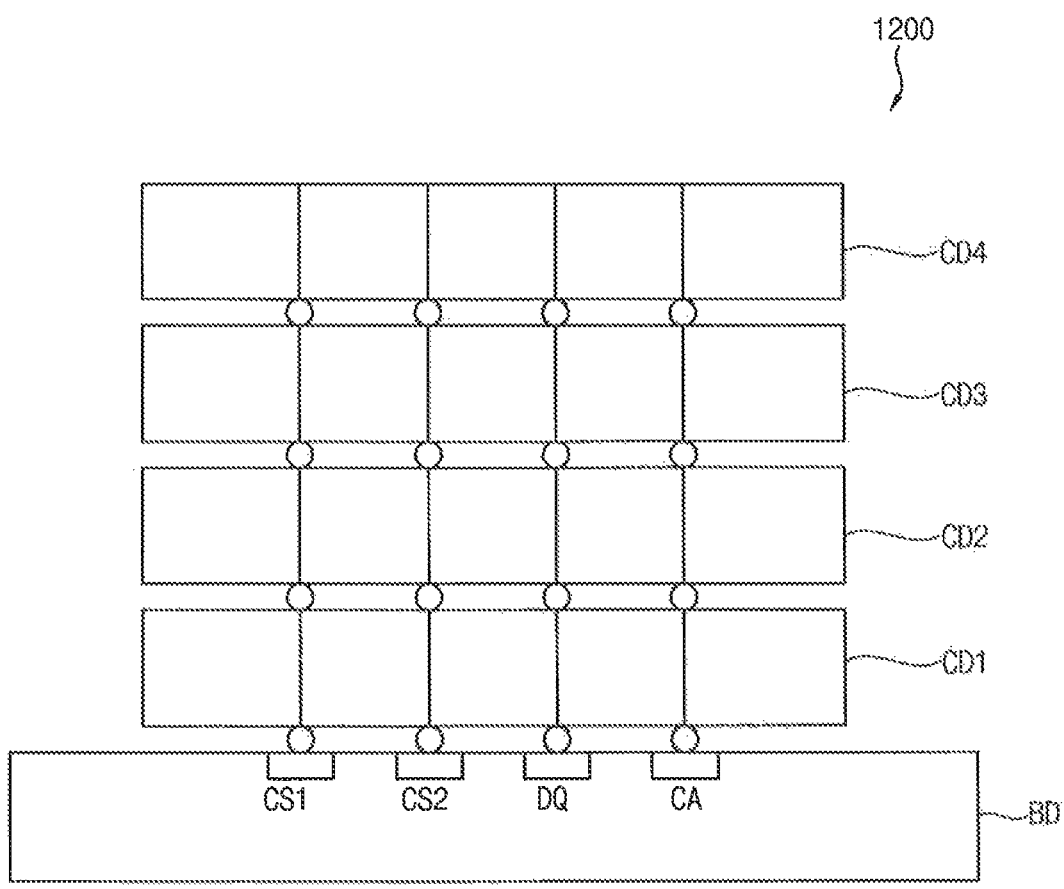
FIG. 3 is a diagram illustrating a memory apparatus of FIG. 2, according to an exemplary embodiment of the present inventive concept.

FIG. 3 is a diagram illustrating the memory apparatus 1200 of FIG. 2, according to an exemplary embodiment of the present inventive concept.

Referring to FIGS. 1 to 3, the buffer die BD and the core dies CD1 to CD4 may be stacked. The buffer die BD and the core dies CD1 to CD4 may be connected to each other through the through silicon via.

The through silicon via is electrically connected to internal circuits of the core dies CD1 to CD4 and the buffer die BD. For example, the electric connection between the through silicon via and the internal circuits of the core dies CD1 to CD4 and the buffer die BD may be formed by a selective cutting of an electric fuse or a selective opening and closing of a switching circuit in response to a control signal.

The second core die CD2 may be disposed directly on the first core die CD1. The third core die CD3 may be disposed directly on the second core die CD2. The fourth core die CD4 may be disposed directly on the third core die CD3. For example, the through silicon via for transmitting a first common chip select signal CS1 may be electrically connected to the internal circuits of the first core die CD1 and the third core die CD3. The through silicon via for transmitting a second common chip select signal CS2 may be electrically connected to the internal circuits of the second core die CD2 and the fourth core die CD4. The through silicon via for transmitting a command-address signal CA may be electrically connected to the internal circuits of each of the first to fourth core dies CD1 to CD4. The through silicon via for transmitting the data signal DQ may be electrically connected to the internal circuits of each of the first to fourth core dies CD1 to CD4.

Figure 4:
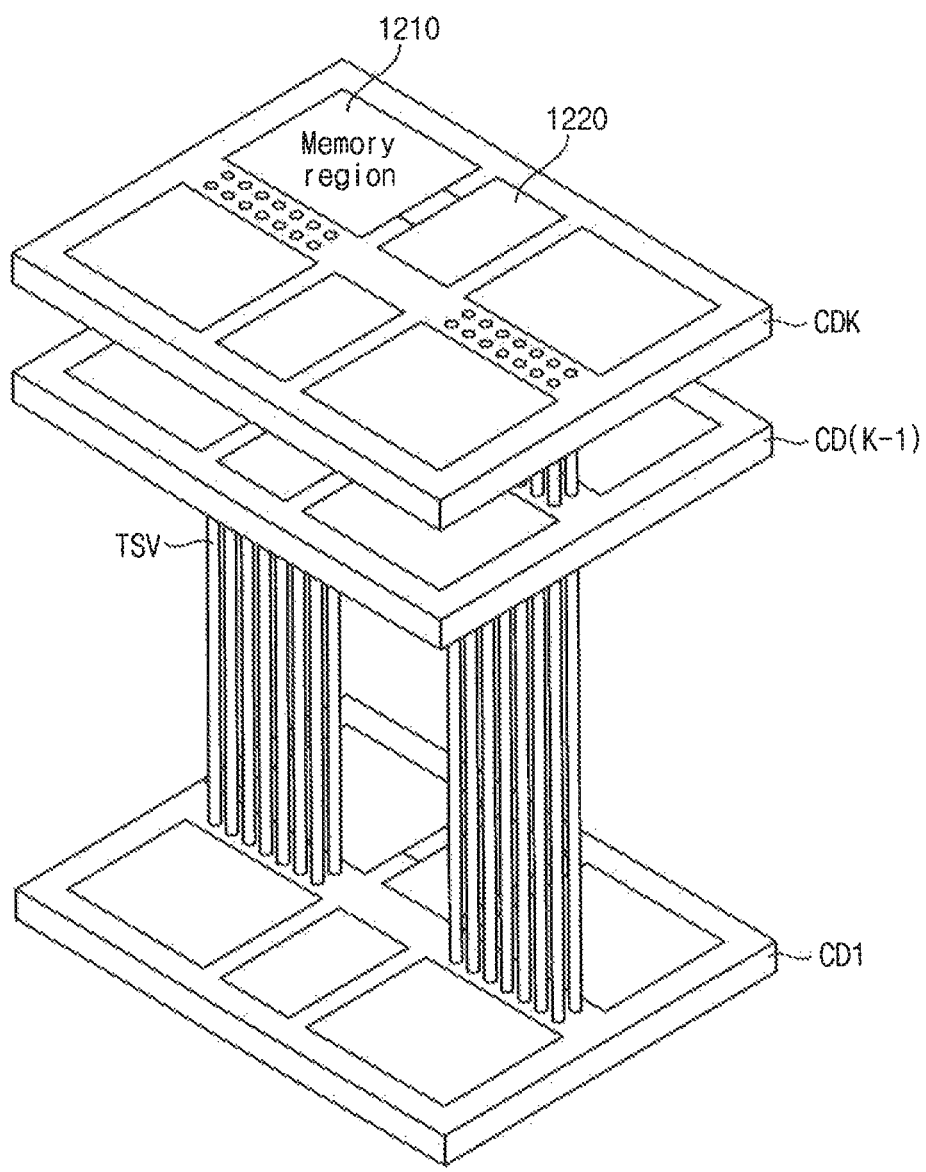
FIG. 4 is a diagram illustrating core dies of the memory apparatus of FIG. 2, according to an exemplary embodiment of the present inventive concept.

FIG. 4 is a diagram illustrating the core dies CD1 to CD4 of the memory apparatus 1200 of FIG. 2, according to an exemplary embodiment of the present inventive concept.

Referring to FIGS. 1 to 4, the memory apparatus 1200 may include a plurality of core dies or core layers CD1 to CDK. Here, K is a positive integer equal to or greater than two.

The core dies CD1 to CDK (also referred to as first to K-th core dies) transmit signals through a through silicon via TSV. The through silicon via TSV is provided in plural. The first core die CD1 may communicate with the memory controller 1100 through the buffer die BD.

The first to K-th core dies CD1 to CDK respectively include peripheral circuits 1220 to drive memory cell array areas (or memory regions) 1210. For example, the peripheral circuits 1220 may include a row driver, e.g., an X-Driver, to drive word lines of the memory cell array area 1210, a column driver, e.g., a Y-Driver, to drive bit lines of the memory cell array area 1210, a data input and output part to control the input and output of the data signal, a command buffer for receiving a command signal CMD and buffering the command signal CMD and an address buffer for receiving an address signal ADDR and buffering the address signal ADDR. The command signal CMD and the address signal ADDR may be received from outside the first to K-th core dies CD1 to CDK.

The first core die CD1 may further include a control logic circuit. The control logic circuit controls access to the memory area 1210 based on the command signal CMD and the address signal ADDR and generates control signals to access the memory area 1210. Alternatively, the control logic circuit may be disposed on the buffer die BD.

Figure 5:
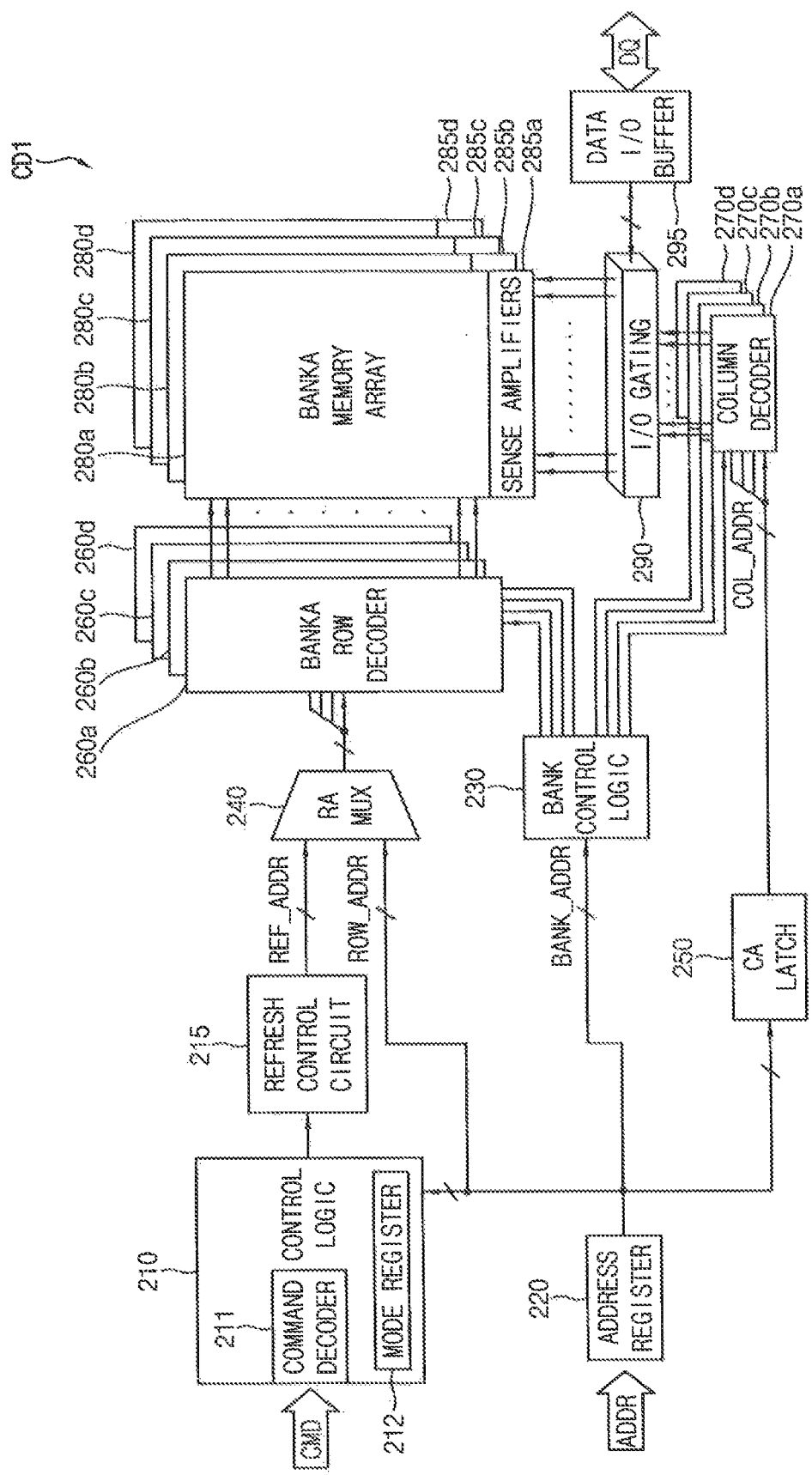
FIG. 5 is a block diagram illustrating a core die of FIG. 2, according to an exemplary embodiment of the present inventive concept.

FIG. 5 is a block diagram illustrating the core die CD1 of FIG. 2, according to an exemplary embodiment of the present inventive concept.

Referring to FIGS. 1 to 5, the core die CD1 includes a control logic circuit 210, a refresh control circuit 215, an address register 220, a bank control logic circuit 230, a row address multiplexer 240, a column address latch 250, a row decoder (e.g., 260a to 260d), a column decoder (e.g., 270a to 270d), a memory cell array (e.g., 280a to 280d), a sense amplifier unit (e.g., 285a to 285d), an input/output (I/O) gating circuit 290 and a data I/O buffer 295.

The memory cell array (e.g., 280a to 280d) may include a plurality of bank arrays, e.g., first, second, third and fourth bank arrays 280a, 280b, 280c and 280d. The row decoder may include a plurality of bank row decoders, e.g., first, second, third and fourth bank row decoders 260a, 260b, 260c and 260d connected to the first to fourth bank arrays 280a, 280b, 280c and 280d, respectively. The column decoder may include a plurality of bank column decoders, e.g., first, second, third and fourth bank column decoders 270a, 270b, 270c and 270d connected to the first to fourth bank arrays 280a, 280b, 280c and 280d, respectively. The sense amplifier unit may include a plurality of bank sense amplifiers, e.g., first, second, third and fourth bank sense amplifiers 285a, 285b, 285c and 285d connected to the first to fourth bank arrays 280a, 280b, 280c and 280d, respectively. The first to fourth bank arrays 280a to 280d, the first to fourth bank row decoders 260a to 260d, the first to fourth bank column decoders 270a to 270d, and the first to fourth bank sense amplifiers 285a to 285d may form first, second, third and fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank. Although FIG. 5 illustrates the core die CD1 including four banks, the core die CD1 may include any number of banks. For example, the core die CD1 may include fewer than four banks or more than four banks.

The address register 220 may receive an address ADDR including a bank address BANK_ADDR, a row address ROW_ADDR and a column address COL_ADDR from a memory controller (e.g., the memory controller 1100 in FIG. 1). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the receipt of the bank address BANK_ADDR. One of the first to fourth bank row decoders 260a to 260d corresponding to the received bank address BANK_ADDR may be activated in response to the bank control signals generated by the bank control logic circuit 230. In addition, one of the first to fourth bank column decoders 270a to 270d corresponding to the received bank address BANK_ADDR may be activated in response to the bank control signals generated by the bank control logic circuit 230.

The refresh control circuit 215 may generate a refresh address REF_ADDR in response to the receipt of a refresh command. For example, the refresh control circuit 215 may include a refresh counter that is configured to sequentially change the refresh address REF_ADDR from a first address of the memory cell array (e.g., 280a to 280d) to a last address of the memory cell array (e.g., 280a to 280d).

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first to fourth bank row decoders 260a to 260d.

The activated one of the first to fourth bank row decoders 260a to 260d may decode the row address output from the row address multiplexer 240, and may activate a word line corresponding to the row address. For example, the activated bank row decoder, e.g., 260a, may apply a word line driving voltage to the word line corresponding to the row address.

The column address latch 250 may receive the column address COL_ADDR from the address register 220, and may temporarily store the received column address COL_ADDR. The column address latch 250 may apply the temporarily stored or received column address COL_ADDR to the first to fourth bank column decoders 270a to 270d.

The activated one of the first to fourth bank column decoders 270a to 270d may decode the column address COL_ADDR output from the column address latch 250, and may control the I/O gating circuit 290 to output data corresponding to the column address COL_ADDR.

The I/O gating circuit 290 may include circuitry for gating I/O data. For example, the I/O gating circuit 290 may include an input data mask logic, read data latches for storing data output from the first to fourth bank arrays 280a to 280d, and write drivers for writing data to the first to fourth bank arrays 280a to 280d.

Data to be read from one of the first to fourth bank arrays 280a to 280d may be sensed by a sense amplifier, e.g., 285a, coupled to the one bank array, e.g., 280a, and may be stored in the read data latches. The data stored in the read data latches may be provided to the memory controller 1100 via the data I/O buffer 295 and data bus/data terminals DQ. Data received via data bus/data terminals DQ to be written to one of the first to fourth bank arrays 280a to 280d may be provided from the memory controller 1100 to the data I/O buffer 295. The data received via data bus/data terminals DQ provided to the data I/O buffer 295 may be written to the one bank array, e.g., 280a, via the write drivers.

The control logic circuit 210 may control an operation of the core die CD1. For example, the control logic circuit 210 may generate control signals for the core die CD1 to perform a write operation or a read operation. The control logic circuit 210 may include a command decoder 211 that decodes a command CMD received from the memory controller 1100 and a mode register 212 that sets an operation mode of the core die CD1. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The control logic circuit 210 may further receive a clock signal (e.g., CLK) and a clock enable signal (e.g., /CKE) for operating the core die CD1 in a synchronous manner.

Figure 6A:
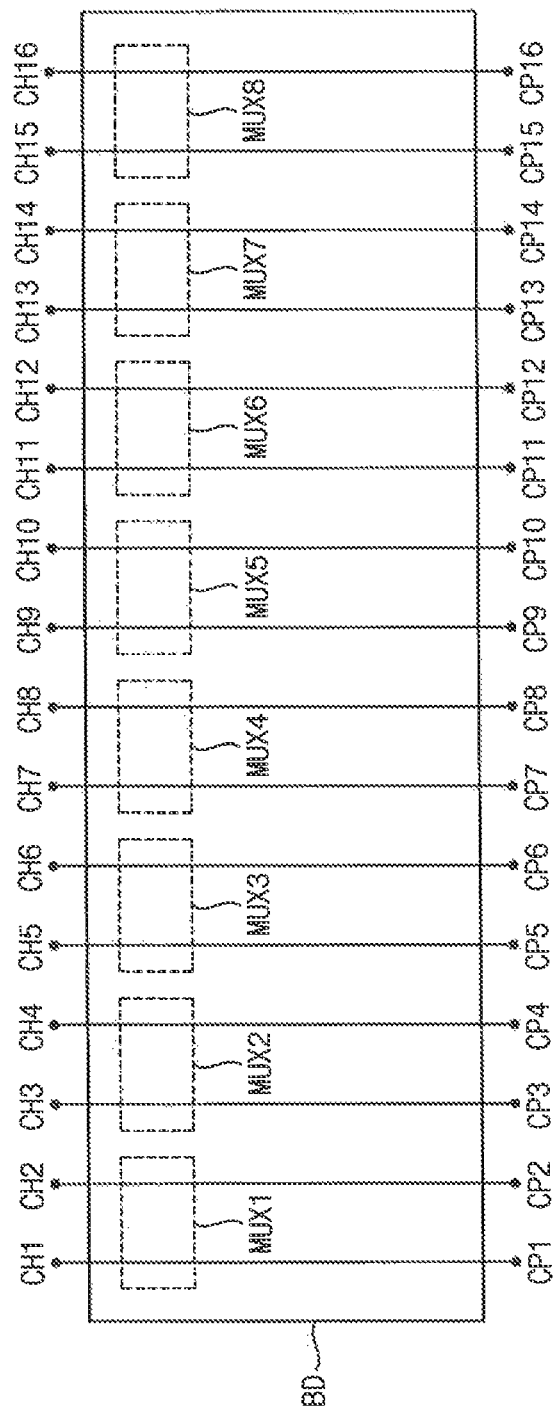
FIG. 6A is a diagram illustrating a first connection status of path selectors disposed on a buffer die of FIG. 2, according to an exemplary embodiment of the present inventive concept.
Figure 6B:
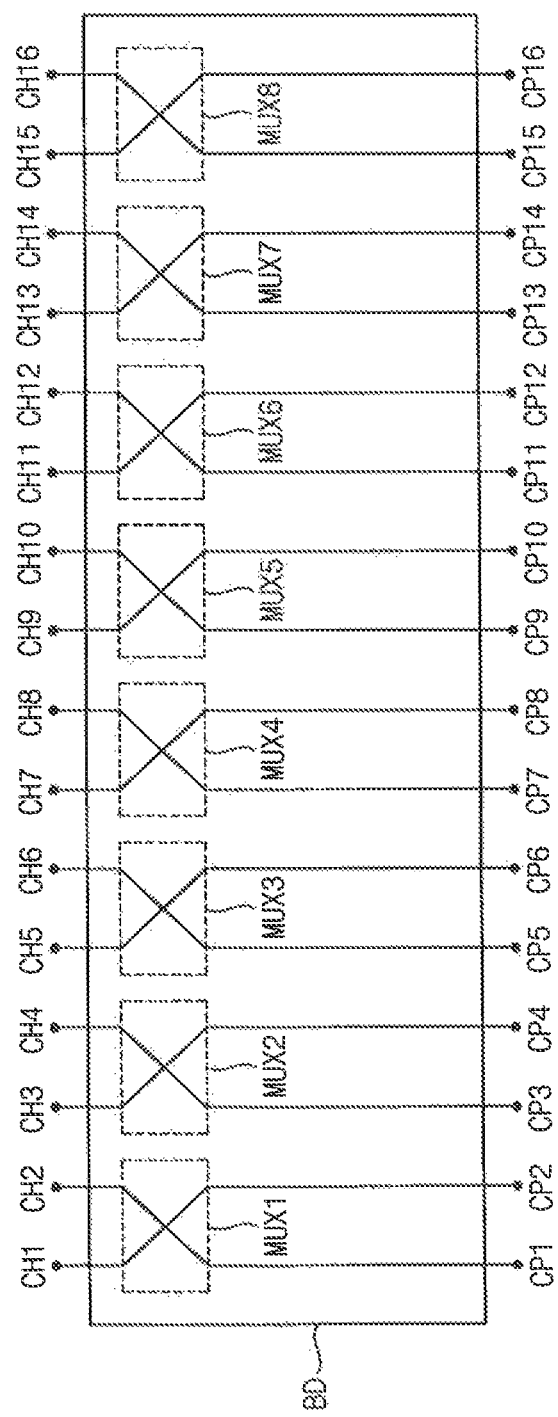
FIG. 6B is a diagram illustrating a second connection status of the path selectors disposed on the buffer die of FIG. 2, according to an exemplary embodiment of the present inventive concept.

FIG. 6A is a diagram illustrating a first connection status of path selectors disposed on the buffer die BD of FIG. 2, according to an exemplary embodiment of the present inventive concept. FIG. 6B is a diagram illustrating a second connection status of the path selectors disposed on the buffer die BD of FIG. 2, according to an exemplary embodiment of the present inventive concept.

Referring to FIGS. 1 to 6B, the buffer die BD may include a plurality of buffers. The buffers are connected to the channel paths CP1 to CP16 and output the data signals DQ transmitted through the channel paths CP1 to CP16 to the channels CH1 to CH16. The buffer die BD may include a path selector MUX1, MUX2, MUX3, MUX4, MUX5, MUX6, MUX7 and MUX8 for changing the connections between the channels CH1 to CH16 and the channel paths CP1 to CP16. For example, the path selector MUX1 to MUX8 may be a multiplexer. The memory controller 1100 may output a connection control signal for changing a status of the path selector MUX1 to MUX8 to the path selector MUX1 to MUX8.

The path selector MUX1 to MUX8 may set the connections between the channels CH1 to CH16 and the channel paths CP1 to CP16 to a first connection status in a normal operation mode. In other words, the path selector MUX1 to MUX8 may set the connections between the channels CH1 to CH16 and the channel paths CP1 to CP16 to a first connection status in a first operation mode.

When an error of the memory system 1000 occurs in the first connection status, the memory controller 1100 detects the error of the memory system 1000.

And then, the memory controller 1100 outputs the connection control signal to the path selector MUX1 to MUX8 so that the connections between the channels CH1 to CH16 and the channel paths CP1 to CP16 are changed from the first connection status to a second connection status. In other words, when there is an error, the connection status is changed. The memory controller 1100 detects the error of the memory system 1000 in the second connection status of the channels CH1 to CH16 and the channel paths CP1 to CP16.

When the error is detected at the same channel path in the first connection status and in the second connection status, the memory controller 1100 may determine that the error of the memory system 1000 is the error of the channel path. In other words, when the error occurs in the first channel path CP1 in both of the first connection status and the second connection status, it is determined that the error has occurred in the first channel path CP1.

When the error is detected at different channel paths in the first connection status and in the second connection status, the memory controller 1100 may determine that the error of the memory system 1000 is the error of the channel of the memory apparatus 1200.

Referring to FIGS. 2, 6A and 6B, the memory apparatus 1200 may include the four core dies CD1 to CD4 and each of the core dies CD1 to CD4 may include four of the channels CH1 to CH16 in the present exemplary embodiment. In addition, each path selector MUX1 to MUX8 may be connected to two channels and each path selector MUX1 to MUX8 may be connected two channels adjacent to each other in the same core die in the present exemplary embodiment. Thus, the memory apparatus 1200 may include eight path selectors MUX1 to MUX8.

Although the memory apparatus 1200 includes four core dies in the present exemplary embodiment, the present inventive concept is not limited thereto. In addition, although each of the core dies includes four channels in the present exemplary embodiment, the present inventive concept is not limited thereto.

For example, the first core die CD1 includes a first channel CH1 and a second channel CH2. A first path selector MUX1 is connected to the first channel CH1 and the second channel CH2. The first path selector MUX1 connects the first channel CH1 to a first channel path CP1 and the second channel CH2 to a second channel path CP2 in the first connection status, see FIG. 6A. The first path selector MUX1 connects the first channel CH1 to the second channel path CP2 and the second channel CH2 to the first channel path CP1 in the second connection status, see FIG. 6B.

When a first error is detected at the first channel path CP1 connected to the first channel CH1 in the first connection status and the first error is detected at the first channel path CP1 connected to the second channel CH2 in the second connection status, the memory controller 1100 may determine that the error has occurred at the first channel path CP1.

In other words, when the error is detected at the same channel path although the channel paths are swapped in real time to different channels, it is determined that the error has occurred at the channel path (not the channel).

For example, the error of the channel path may be generated by the error of the data signal transmitted to the channel of the memory apparatus 1200 or the distortion of the data signal due to crosstalk between adjacent channel paths. For example, the error of the channel path may also be generated by the distortion of the data signal due to a bridge between adjacent channel paths. For example, the error of the channel path may be generated by the distortion of the data signal due to an error of a pin between the memory controller 1100 and the channel path.

When the error occurs at the channel path, the error of the channel path may be repaired using the repair channel path RP in the interposer 1300.

When a second error is detected at the first channel path CP1 connected to the first channel CH1 in the first connection status and the second error is detected at the second channel path CP2 connected to the first channel CH1 in the second connection status, the memory controller 1100 may determine that the error has occurred at the channel of the memory apparatus 1200.

In other words, when the error is detected at different channel paths due to the swap of the channel paths in real time, it is determined that the error is occurs at the channel (not the channel path).

For example, the error of the channel may be a reading error and/or a writing error generated at a cell of the channel. For example, the error of the channel may be a retention error generated at the cell of the channel. For example, the error of the channel may be a signal transmitting error generated at the cell of the channel.

When the error is occurs at the channel, the error of the channel may be repaired using a repair cell and a repair line formed in the channel.

For example, the first core die CD1 includes a third channel CH3 and a fourth channel CH4. A second path selector MUX2 is connected to the third channel CH3 and the fourth channel CH4. The second path selector MUX2 connects the third channel CH3 to a third channel path CP3 and the fourth channel CH4 to a fourth channel path CP4 in the first connection status, as shown in FIG. 6A. The second path selector MUX2 connects the third channel CH3 to the fourth channel path CP4 and the fourth channel CH4 to the third channel path CP3 in the second connection status, as shown in FIG. 6B.

When a first error is detected at the third channel path CP3 connected to the third channel CH3 in the first connection status and the first error is detected at the third channel path CP3 connected to the fourth channel CH4 in the second connection status, the memory controller 1100 may determine that the error has occurred at the third channel path CP3.

When a second error is detected at the third channel path CP3 connected to the third channel CH3 in the first connection status and the second error is detected at the fourth channel path CP4 connected to the third channel CH3 in the second connection status, the memory controller 1100 may determine that the error has occurred at the channel of the memory apparatus 1200.

As shown in FIGS. 6A and 6B, third to eighth path selectors MUX3 to MUX8 may be operated in the same way as the first path selector MUX1 and the second path selector MUX2.

According to the present exemplary embodiment, when the error of the memory system 1000 is detected in the first connection status of the channels CH1 to CH16 of the memory apparatus 1200 and the channel paths CP1 to CP16, the connection status of the channels CH1 to CH16 and the channel paths CP1 to CP16 is changed from the first connection status to the second connection status and the error of the memory system 1000 is detected again in the second connection status of the channels CH1 to CH16 and the channel paths CP1 to CP16. Accordingly, it can be determined whether the error of the memory system is the error of the channel of the memory apparatus 1200 or the error of the channel path. In addition, the error of the memory system 1000 may be determined in a real workload system without transmitting the memory system 1000 to the independent error determining system.

Figure 7A:
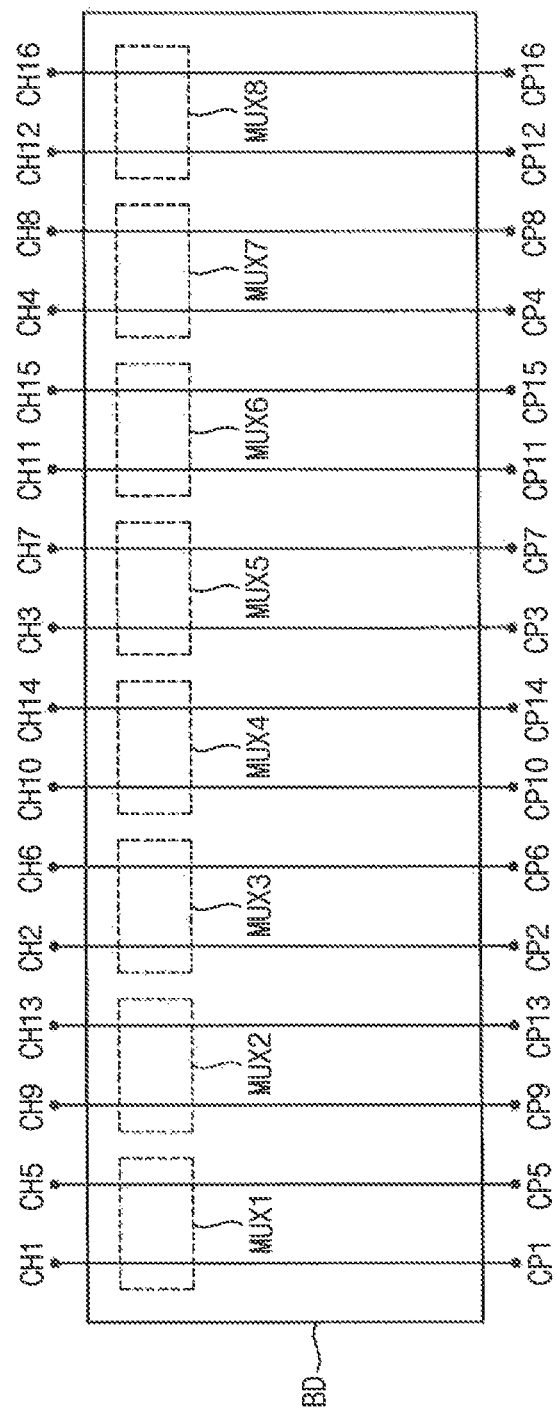
FIG. 7A is a diagram illustrating a first connection status of the path selectors disposed on the buffer die of FIG. 2, according to an exemplary embodiment of the present inventive concept.
Figure 7B:
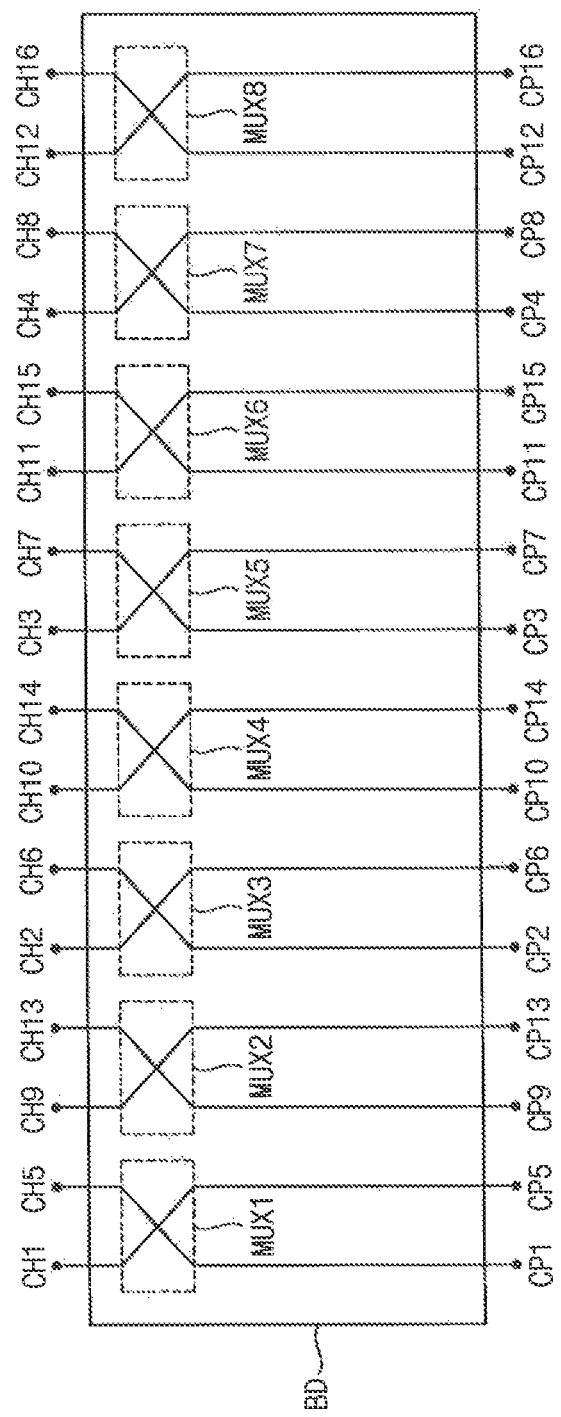
FIG. 7B is a diagram illustrating a second connection status of the path selectors disposed on the buffer die of FIG. 2, according to an exemplary embodiment of the present inventive concept.

FIG. 7A is a diagram illustrating a first connection status of the path selectors MUX1 to MUX8 disposed on the buffer die BD of FIG. 2, according to an exemplary embodiment of the present inventive concept. FIG. 7B is a diagram illustrating a second connection status of the path selectors MUX1 to MUX8 disposed on the buffer die BD of FIG. 2, according to an exemplary embodiment of the present inventive concept.

Referring to FIGS. 1 to 5, 7A and 7B, the memory apparatus 1200 may include the four core dies CD1 to CD4 and each of the core dies CD1 to CD4 may include four of the channels CH1 to CH16 in the present exemplary embodiment. In addition, each path selector MUX1 to MUX8 may be connected to two channels and each path selector MUX1 to MUX8 may be connected two channels in different core dies in the present exemplary embodiment. Thus, the memory apparatus 1200 may include eight path selectors MUX1 to MUX8.

For example, the first core die CD1 includes a first channel CH1 and the second core die CD2 includes a fifth channel CH5. A first path selector MUX1 is connected to the first channel CH1 and the fifth channel CH5. The first path selector MUX1 connects the first channel CH1 to a first channel path CP1 and the fifth channel CH5 to a fifth channel path CP5 in the first connection status, as shown in FIG. 7A. The first path selector MUX1 connects the first channel CH1 to the fifth channel path CP5 and the fifth channel CH5 to the first channel path CP1 in the second connection status, as shown in FIG. 7B.

When a first error is detected at the first channel path CP1 connected to the first channel CH1 in the first connection status and the first error is detected at the first channel path CP1 connected to the fifth channel CH5 in the second connection status, the memory controller 1100 may determine that the error has occurred at the first channel path CP1.

When a second error is detected at the first channel path CP1 connected to the first channel CH1 in the first connection status and the second error is detected at the fifth channel path CP5 connected to the first channel CH1 in the second connection status, the memory controller 1100 may determine that the error is occurred at the channel of the memory apparatus 1200.

For example, the third core die CD3 includes a ninth channel CH9 and the fourth core die CD4 includes a thirteenth channel CH13. A second path selector MUX2 is connected to the ninth channel CH9 and the thirteenth channel CH13. The second path selector MUX2 connects the ninth channel CH9 to a ninth channel path CP9 and the thirteenth channel CH13 to a thirteenth channel path CP13 in the first connection status, as shown in FIG. 7A. The second path selector MUX2 connects the ninth channel CH9 to the thirteenth channel path CP13 and the thirteenth channel CH13 to the ninth channel path CP9 in the second connection status, as shown in FIG. 7B.

When a first error is detected at the ninth channel path CP9 connected to the ninth channel CH9 in the first connection status and the first error is detected at the ninth channel path CP9 connected to the thirteenth channel CH13 in the second connection status, the memory controller 1100 may determine that the error has occurred at the ninth channel path CP9.

When a second error is detected at the ninth channel path CP9 connected to the ninth channel CH9 in the first connection status and the second error is detected at the thirteenth channel path CP13 connected to the ninth channel CH9 in the second connection status, the memory controller 1100 may determine that the error has occurred at the channel of the memory apparatus 1200.

As shown in FIGS. 7A and 7B, third to eighth path selectors MUX3 to MUX8 may be operated in the same way as the first path selector MUX1 and the second path selector MUX2.

According to the present exemplary embodiment, the error of the memory system 1000 is detected in the first connection status and in the second connection status so that it can be determined whether the error of the memory system is the error of the channel of the memory apparatus 1200 or the error of the channel path. In addition, the error of the memory system 1000 may be determined in a real workload system without having to transmit the memory system 1000 to the independent error determining system.

In addition, the path selector MUX1 to MUX8 may be connected to channels of the different core dies CD1 to CD4 and may swap the connection status so that a reliability of the error determination may be enhanced.

Figure 8A:
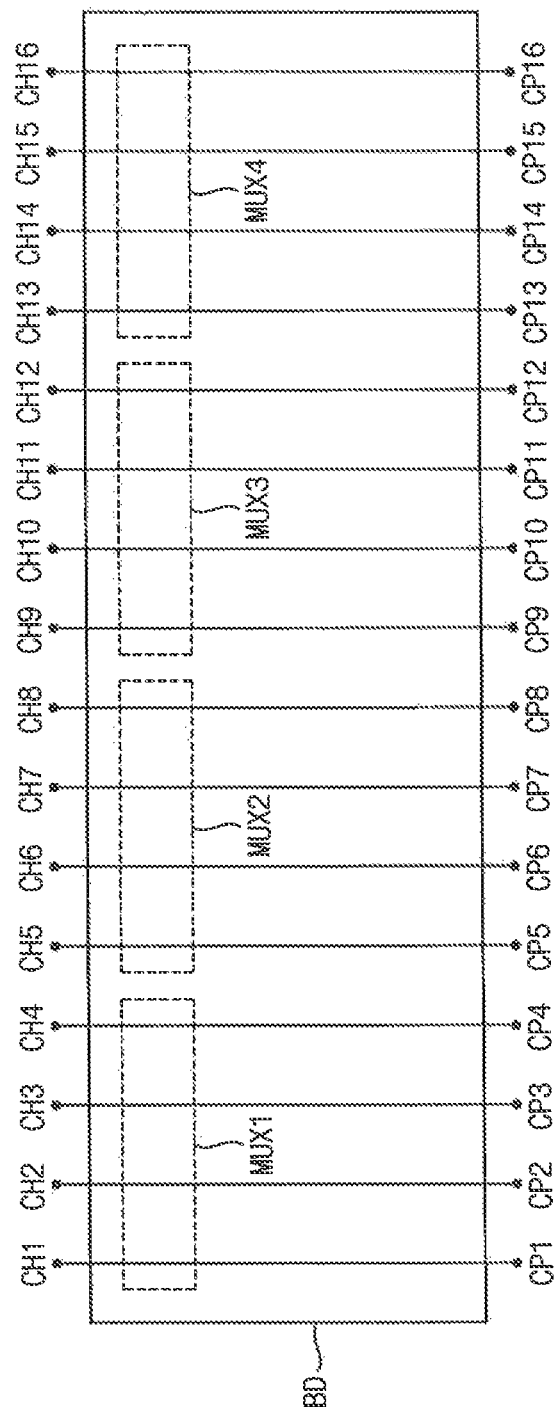
FIG. 8A is a diagram illustrating a first connection status of the path selectors disposed on the buffer die of FIG. 2, according to an exemplary embodiment of the present inventive concept.
Figure 8B:
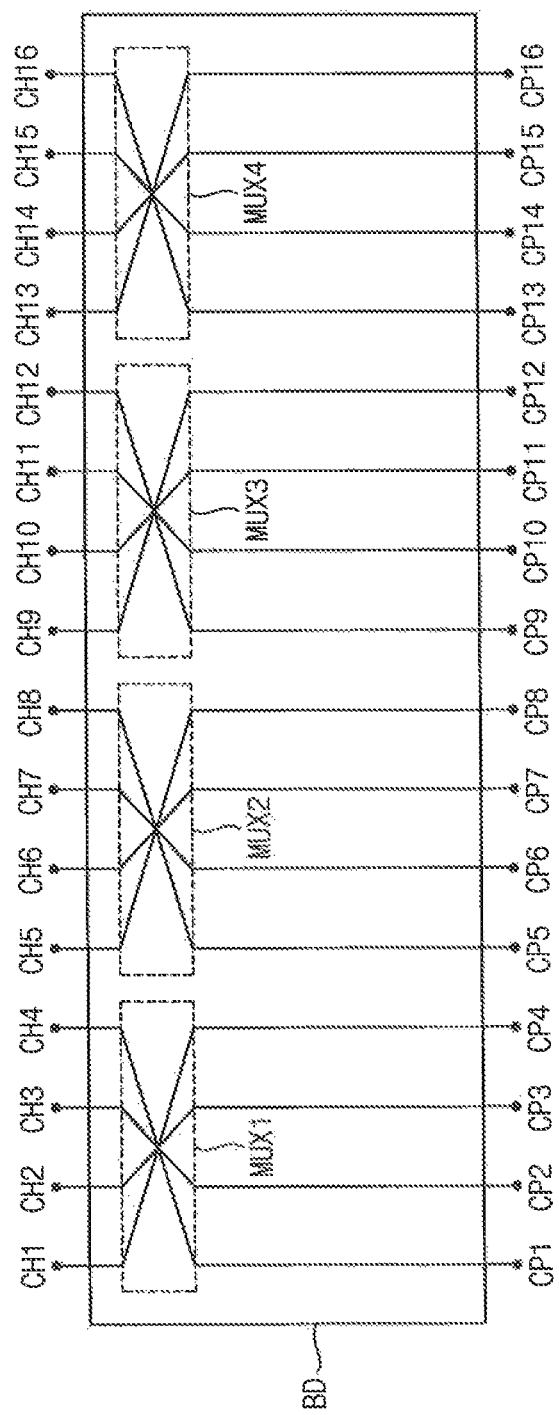
FIG. 8B is a diagram illustrating a second connection status of the path selectors disposed on the buffer die of FIG. 2, according to an exemplary embodiment of the present inventive concept.

FIG. 8A is a diagram illustrating a first connection status of the path selectors MUX1 to MUX8 disposed on the buffer die BD of FIG. 2, according to an exemplary embodiment of the 3 present inventive concept. FIG. 8B is a diagram illustrating a second connection status of the path selectors MUX1 to MUX8 disposed on the buffer die BD of FIG. 2, according to an exemplary embodiment of the present inventive concept.

Referring to FIGS. 1 to 5, 8A and 8B, the memory apparatus 1200 may include the four core dies CD1 to CD4 and each of the core dies CD1 to CD4 may include four of the channels CH1 to CH16 in the present exemplary embodiment. In addition, each path selector MUX1 to MUX4 may be connected to four channels and each path selector MUX1 to MUX4 may be connected four channels in the same core die in the present exemplary embodiment. Thus, the memory apparatus 1200 may include four path selectors MUX1 to MUX4.

For example, the first core die CD1 includes first to fourth channels CH1 to CH4. A first path selector MUX1 is connected to the first to fourth channels CH1 to CH4. The first path selector MUX1 connects the first channel CH1 to a first channel path CP1, the second channel CH2 to a second channel path CP2, the third channel CH3 to a third channel path CP3 and the fourth channel CH4 to a fourth channel path CP4 in the first connection status, as shown in FIG. 8A.

The first path selector MUX1 connects the first channel CH1 to the fourth channel path CP4, the second channel CH2 to the third channel path CP3, the third channel CH3 to the second channel path CP2 and the fourth channel CH4 to the first channel path CP1 in the second connection status, as shown in FIG. 8B.

Using the above path selectors MUX1 to MUX4, it is determined that the error of the memory system 1000 is the error of the channel of the memory apparatus 1200 or the error of the channel path.

It is to be understood that the first path selector MUX1 may form a third connection status different from the first connection status and the second connection status to enhance a reliability of the error determination. For example, the first path selector MUX1 may connect the first channel CH1 to the second channel path CP2, the second channel CH2 to the third channel path CP3, the third channel CH3 to the fourth channel path CP4 and the fourth channel CH4 to the first channel path CP1 in the third connection status.

As shown in FIGS. 8A and 8B, second to fourth path selectors MUX2 to MUX4 may be operated in the same way as the first path selector MUX1.

According to the present exemplary embodiment, the error of the memory system 1000 is detected in the first connection status and in the second connection status so that it can be determined whether the error of the memory system 1000 is the error of the channel of the memory apparatus 1200 or the error of the channel path. In addition, the error of the memory system 1000 may be determined in a real workload system without transmitting the memory system 1000 to the independent error determining system.

In addition, the path selector, e.g., MUX1, MUX2, MUX3 or MUX4, may further detect the error of the memory system 1000 in the third connection status so that a reliability of the error determination may be enhanced.

Figure 9A:
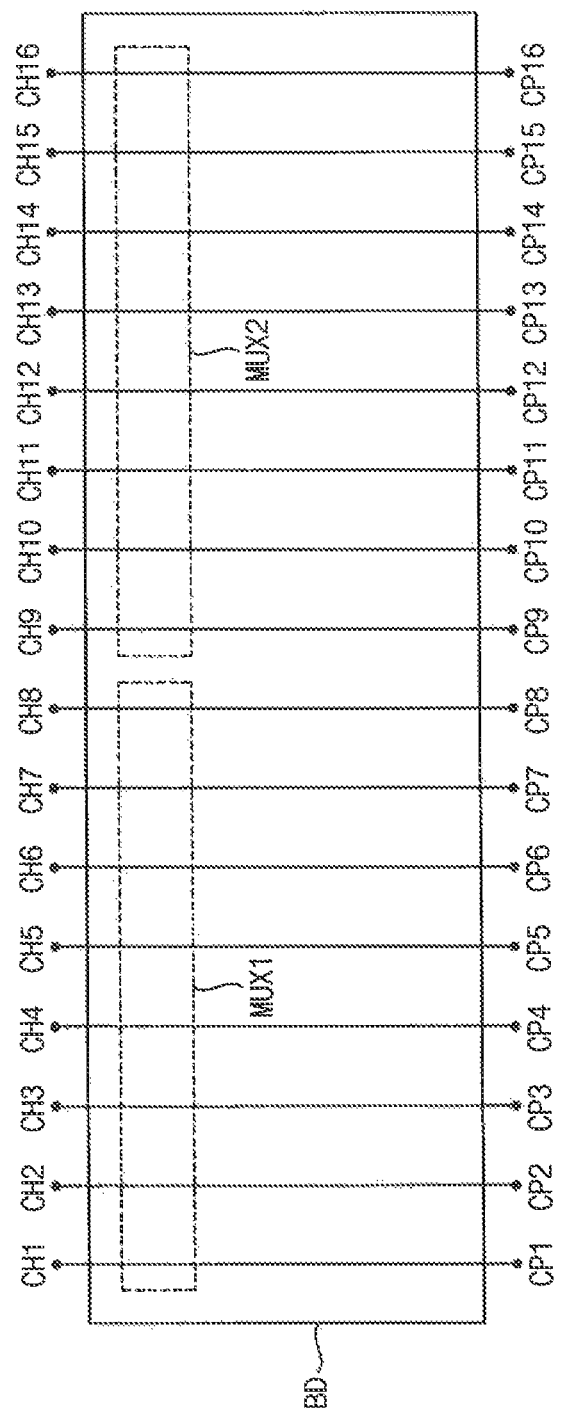
FIG. 9A is a diagram illustrating a first connection status of the path selectors disposed on the buffer die of FIG. 2, according to an exemplary embodiment of the present inventive concept.

FIG. 9A is a diagram illustrating a first connection status of the path selectors MUX1 and MUX2 disposed on the buffer die BD of FIG. 2, according to an exemplary embodiment of the present inventive concept. FIG. 9B is a diagram illustrating a second connection status of the path selectors MUX1 and MUX2 disposed on the buffer die BD of FIG. 2, according to an exemplary embodiment of the present inventive concept.

Referring to FIGS. 1 to 5, 9A and 9B, the memory apparatus 1200 may include the four core dies CD1 to CD4 and each of the core dies CD1 to CD4 may include four of the channels CH1 to CH16 in the present exemplary embodiment. In addition, each path selector MUX1 and MUX2 may be connected to eight channels and each path selector MUX1 and MUX2 may be connected four adjacent channels in the same core die and four adjacent channels in the adjacent core die in the present exemplary embodiment. Thus, the memory apparatus 1200 may include two path selectors MUX1 and MUX2.

For example, the first core die CD1 includes first to fourth channels CH1 to CH4 and the second core die CD2 includes fifth to eighth channels CH5 to CH8. A first path selector MUX1 is connected to the first to eighth channels CH1 to CH8. The first path selector MUX1 connects the first channel CH1 to a first channel path CP1, the second channel CH2 to a second channel path CP2, the third channel CH3 to a third channel path CP3, the fourth channel CH4 to a fourth channel path CP4, the fifth channel CH5 to a fifth channel path CP5, the sixth channel CH6 to a sixth channel path CP6, the seventh channel CH7 to a seventh channel path CP7 and the eighth channel CH8 to an eighth channel path CP8 in the first connection status, as shown in FIG. 9A.

The first path selector MUX1 connects the first channel CH1 to the eighth channel path CP8, the second channel CH2 to the seventh channel path CP7, the third channel CH3 to the sixth channel path CP6, the fourth channel CH4 to the fifth channel path CP5, the fifth channel CH5 to the fourth channel path CP4, the sixth channel CH6 to the third channel path CP3, the seventh channel CH7 to the second channel path CP2 and the eighth channel CH8 to the first channel path CP1 in the second connection status, as shown in FIG. 9B.

Using the above path selectors MUX1 and MUX2, it can be determined that the error of the memory system 1000 is the error of the channel of the memory apparatus 1200 or the error of the channel path.

It is to be understood that the first path selector MUX1 may form a third connection status different from the first connection status and the second connection status to enhance a reliability of the error determination.

As shown in FIGS. 9A and 9B, a second path selector MUX2 may be operated in the same way as the first path selector MUX1.

According to the present exemplary embodiment, the error of the memory system 1000 is detected in the first connection status and in the second connection status so that it can be determined whether the error of the memory system 1000 is the error of the channel of the memory apparatus 1200 or the error of the channel path. In addition, the error of the memory system 1000 may be determined in a real workload system without having to transmit the memory system 1000 to the independent error determining system.

In addition, the path selector, e.g., MUX1 or MUX2, may further detect the error of the memory system 1000 in the third connection status so that a reliability of the error determination may be enhanced.

In addition, the path selector, e.g., MUX1 and MUX2, may be connected to channels of the different core dies and may swap the connection status so that the reliability of the error determination may be enhanced.

Figure 10A:
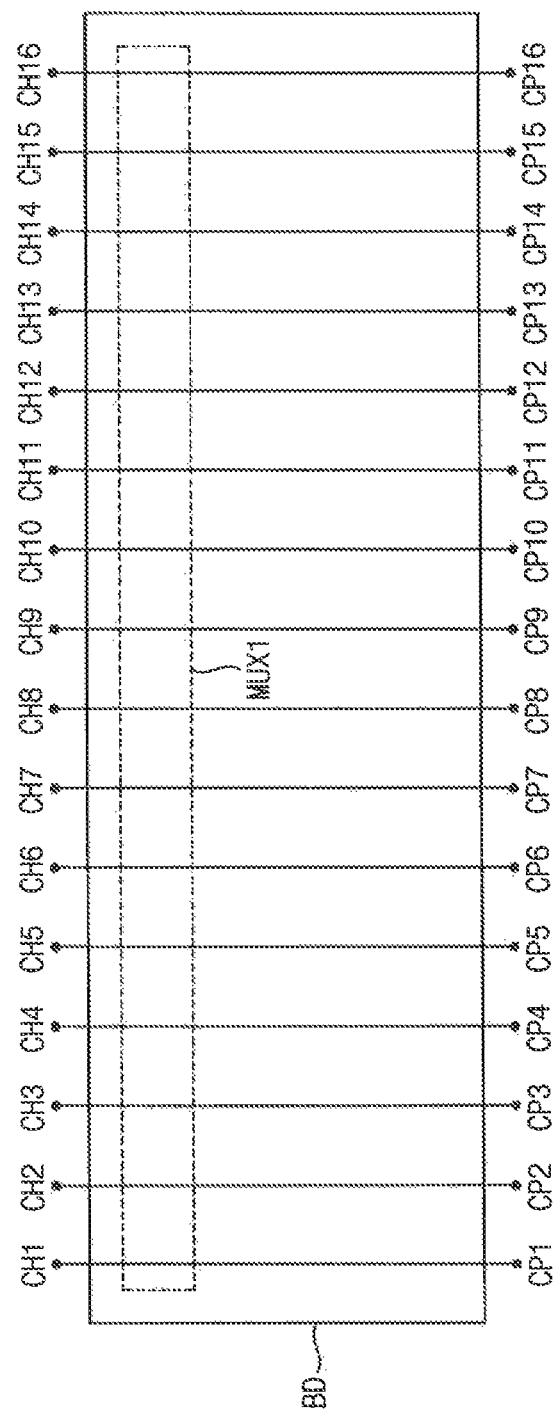
FIG. 10A is a diagram illustrating a first connection status of the path selector disposed on the buffer die of FIG. 2, according to an exemplary embodiment of the present inventive concept.
Figure 10B:
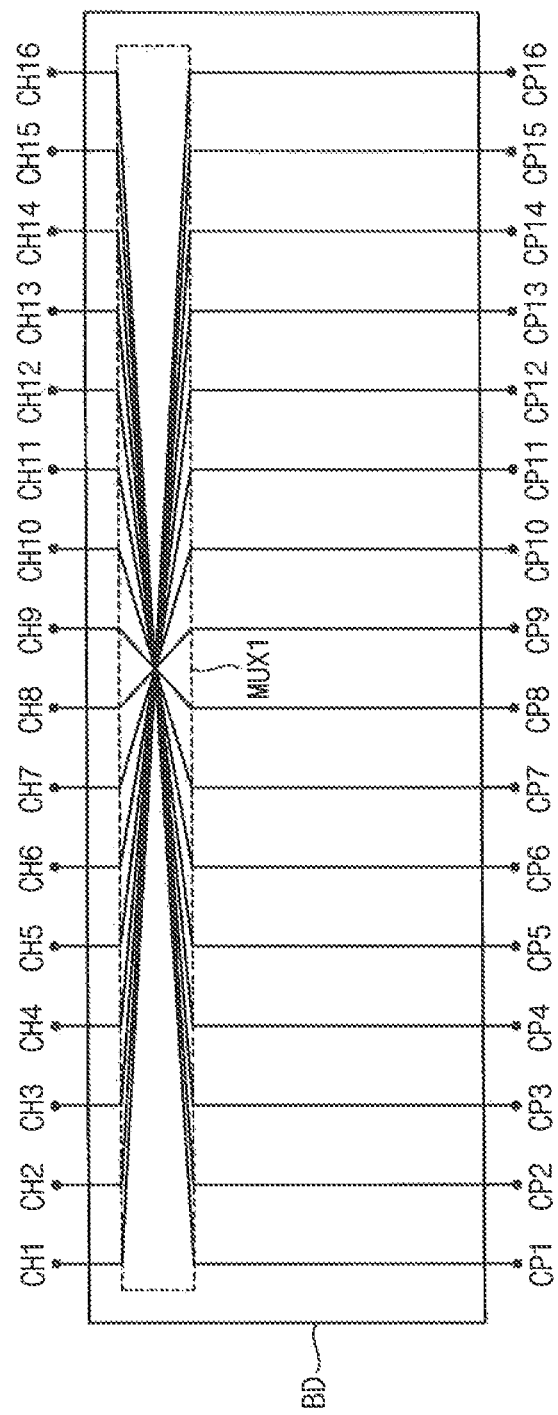
FIG. 10B is a diagram illustrating a second connection status of the path selector disposed on the buffer die of FIG. 2, according to an exemplary embodiment of the present inventive concept.

FIG. 10A is a diagram illustrating a first connection status of the path selector MUX1 disposed on the buffer die BD of FIG. 2, according to an exemplary embodiment of the present inventive concept. FIG. 10B is a diagram illustrating a second connection status of the path selector MUX1 disposed on the buffer die BD of FIG. 2, according to an exemplary embodiment of the present inventive concept.

Referring to FIGS. 1 to 5, 10A and 10B, the memory apparatus 1200 may include the four core dies CD1 to CD4 and each of the core dies CD1 to CD4 may include four of the channels CH1 to CH16 in the present exemplary embodiment. In addition, the path selector MUX1 may be connected to all of the channels CH1 to CH16. Thus, the memory apparatus 1200 may include a single path selector MUX1.

For example, the first path selector MUX1 is connected to the first to sixteenth channels CH1 to CH16. The first path selector MUX1 may sequentially connect the first to sixteenth channels CH1 to CH16 to first to sixteenth channel paths CP1 to CP16 in the first connection status, as shown in FIG. 10A.

The first path selector MUX1 may sequentially connect the first to sixteenth channels CH1 to CH16 to the sixteenth to first channel paths CP16 to CP1 in the second connection status, as shown in FIG. 10B.

Using the above path selector MUX1, it can be determined that the error of the memory system 1000 is the error of the channel of the memory apparatus 1200 or the error of the channel path.

It is to be understood that the first path selector MUX1 may form various connection statuses different from the first connection status and the second connection status to enhance a reliability of the error determination.

According to the present exemplary embodiment, the error of the memory system 1000 is detected in the first connection status and in the second connection status so that it can be determined whether the error of the memory system 1000 is the error of the channel of the memory apparatus 1200 or the error of the channel path. In addition, the error of the memory system 1000 may be determined in a real workload system without transmitting the memory system 1000 to the independent error determining system.

In addition, the path selector MUX1 may further detect the error of the memory system 1000 in the various connection statuses different from the first and second connection statuses so that a reliability of the error determination may be enhanced.

In addition, the path selector MUX1 may be connected to channels of the different core dies and may swap the connection status so that the reliability of the error determination may be enhanced.

Figure 11:
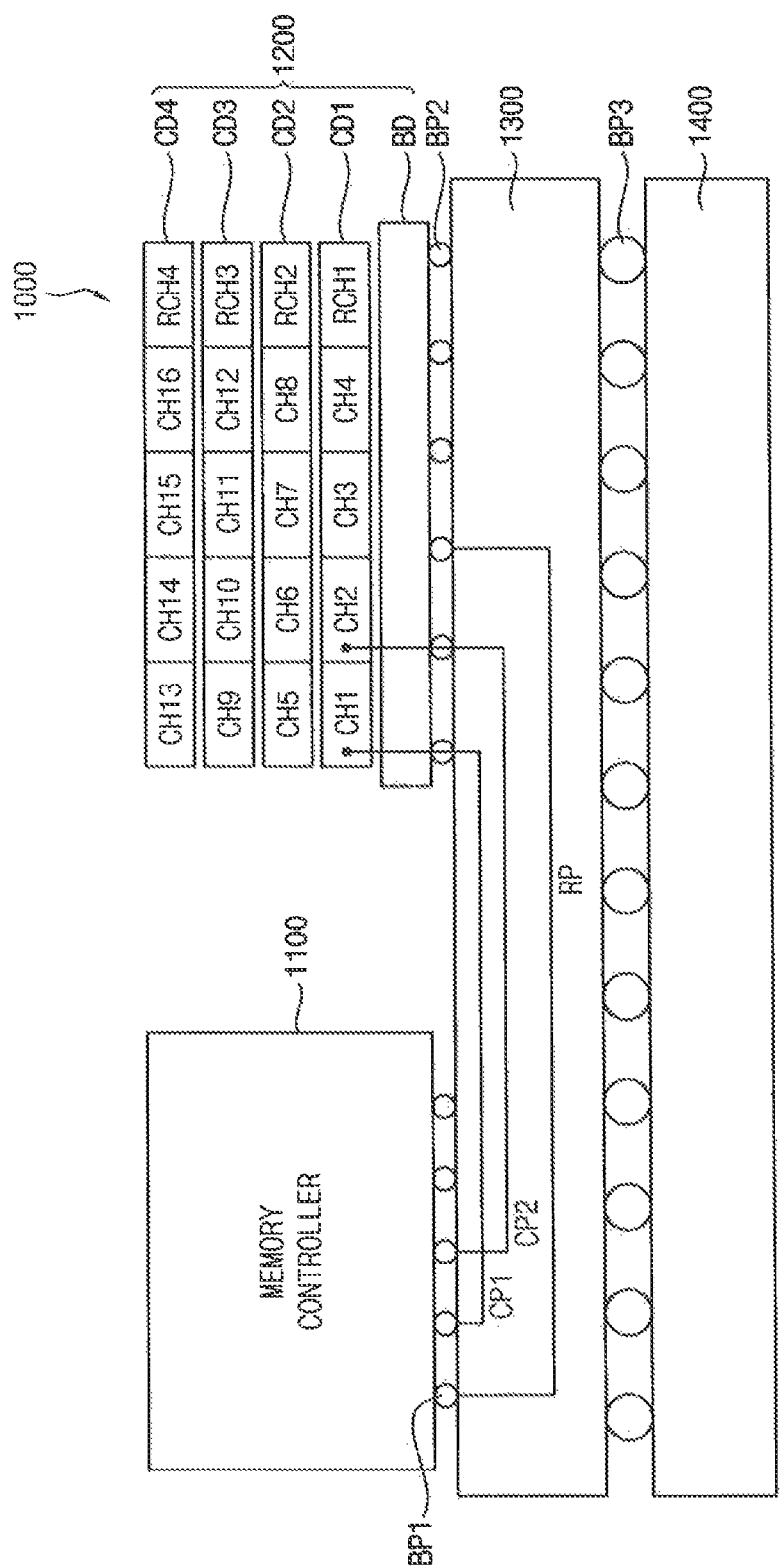
FIG. 11 is a diagram illustrating a memory system according to an exemplary embodiment of the present inventive concept.
Figure 12A:
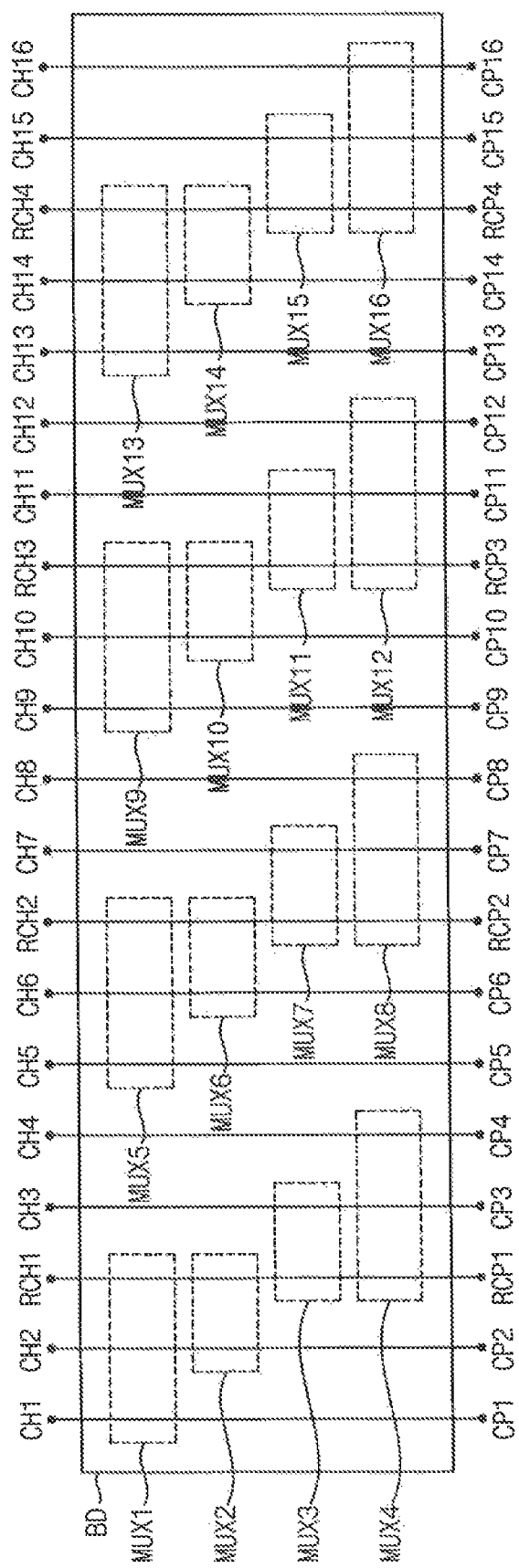
FIG. 12A is a diagram illustrating a first connection status of path selectors disposed on a buffer die of FIG. 11, according to an exemplary embodiment of the present inventive concept.
Figure 12B:
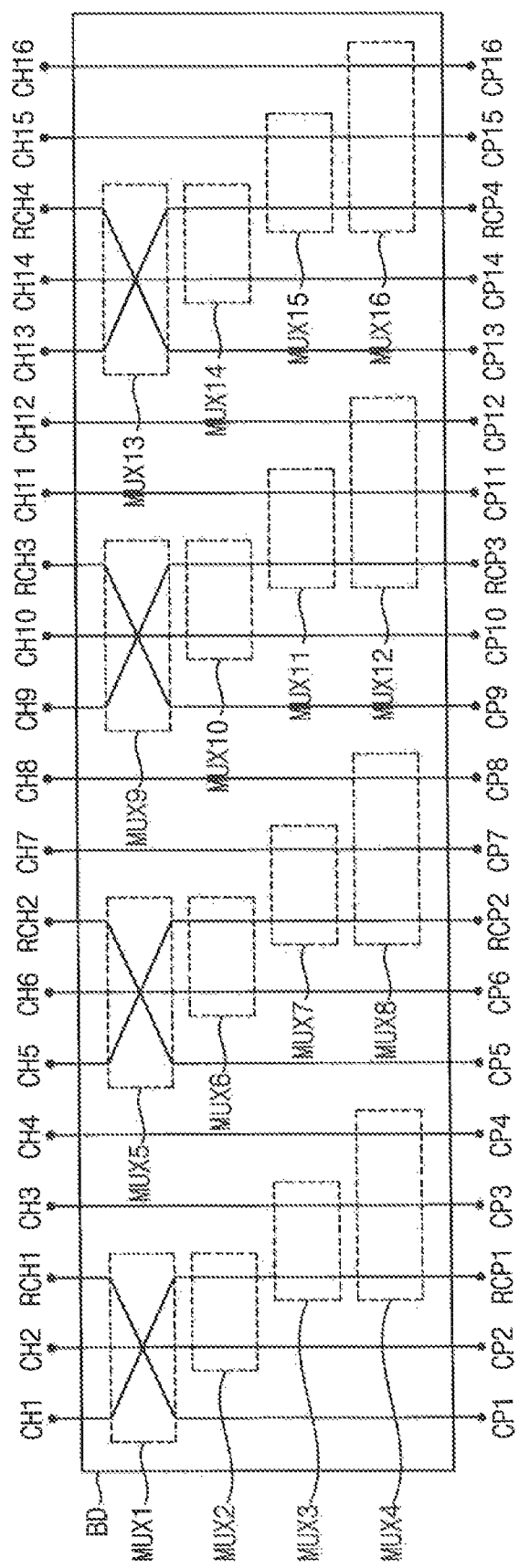
FIG. 12B is a diagram illustrating a second connection status of the path selectors disposed on the buffer die of FIG. 11, according to an exemplary embodiment of the present inventive concept.
Figure 12C:
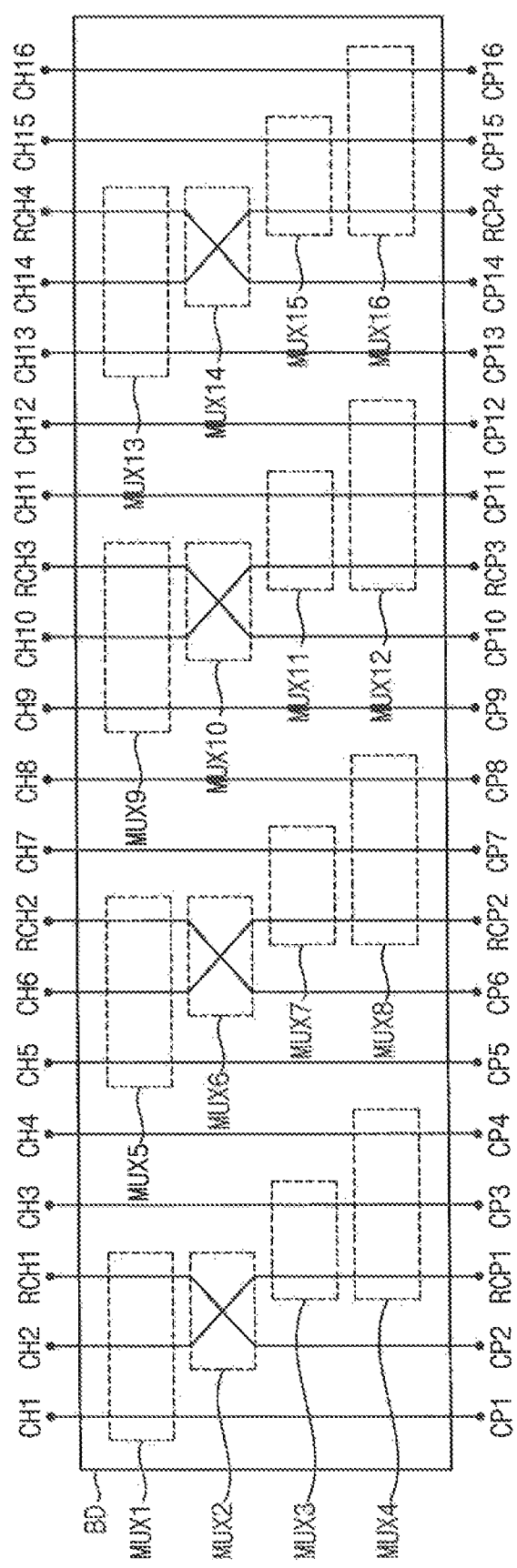
FIG. 12C is a diagram illustrating a third status of the path selectors disposed on the buffer die of FIG. 11, according to an exemplary embodiment of the present inventive concept.

FIG. 11 is a diagram illustrating a memory system 1000 according to an exemplary embodiment of the present inventive concept. FIG. 12A is a diagram illustrating a first connection status of path selectors MUX1 to MUX16 disposed on a buffer die BD of FIG. 11, according to an exemplary embodiment of the present inventive concept. FIG. 12B is a diagram illustrating a second connection status of the path selectors MUX1 to MUX16 disposed on the buffer die BD of FIG. 11, according to an exemplary embodiment of the present inventive concept. FIG. 12C is a diagram illustrating a third status of the path selectors MUX1 to MUX16 disposed on the buffer die BD of FIG. 11, according to an exemplary embodiment of the present inventive concept.

The memory system according to the present exemplary embodiment is substantially the same as the memory system of the previous exemplary embodiments explained referring to FIGS. 1 to 10B except that the memory apparatus of the present exemplary embodiment further includes a reference channel. Thus, the same reference numerals will be used to refer to the same or like parts as those described in the previous exemplary embodiments of FIGS. 1 to 10B. Any repetitive explanation concerning the above elements may be omitted.

Referring to FIGS. 11 to 12C, the memory system 1000 includes a memory controller 1100 and a memory apparatus 1200. The memory system 1000 may further include an interposer 1300 for connecting the memory controller 1100 and the memory apparatus 1200.

The memory apparatus 1200 may include a plurality of channels CH1 to CH16. The memory apparatus 1200 may further include a reference channel. The interposer 1300 may further include a reference channel path for connecting the reference channel to the memory controller 1100. For example, the memory apparatus 1200 may include a plurality of reference channels RCH1, RCH2, RCH3 and RCH4. For example, each core die CD1 to CD4 includes the reference channel. For example, a first core die CD1 disposed on the buffer die BD may include first to fourth channels CH1 to CH4 and a first reference channel RCH1. For example, a second core die CD2 disposed on the first core die CD1 may include fifth to eighth channels CH5 to CH8 and a second reference channel RCH2. For example, a third core die CD3 disposed on the second core die CD2 may include ninth to twelfth channels CH9 to CH12 and a third reference channel RCH3. For example, a fourth core die CD4 disposed on the third core die CD3 may include thirteenth to sixteenth channels CH13 to CH16 and a fourth reference channel RCH4.

The reference channels RCH1 to RCH4 may have an error rate less than error rates of the channels CH1 to CH16. For example, the reference channel RCH1 to RCH4 may pass a tighter reliability test in a manufacturing step of the memory apparatus 1000 compared to the channels CH1 to CH16.

The memory apparatus 1200 may include four core dies CD1 to CD4 and each of the core dies CD1 to CD4 may include four of the channels CH1 to CH16 in the present exemplary embodiment. Each of the core dies CD1 to CD4 may include a reference channel RCH1, RCH2, RCH3 or RCH4. In addition, each path selector MUX1 to MUX16 may be connected to one channel and one reference channel and each path selector MUX to MUX16 may be connected one channel and one reference channel in the same core die in the present exemplary embodiment. Thus, the memory apparatus 1200 may include sixteen path selectors MUX1 to MUX16.

Although the memory apparatus 1200 includes four core dies CD1 to CD4 in the present exemplary embodiment, the present inventive concept is not limited thereto. In addition, although each of the core dies CD1 to CD4 includes four channels in the present exemplary embodiment, the present inventive concept is not limited thereto. In addition, although each of the core dies CD1 to CD4 includes a single reference channel in the present exemplary embodiment, the present inventive concept is not limited thereto. Alternatively, at least one of the core dies CD1 to CD4 may include a plurality of reference channels. Alternatively, the number of the reference channels may be less than the number of the core dies, and thus, at least one of the core dies may not include the reference channel.

For example, the first core die CD1 includes the first channel CH1 to fourth channel CH4. A first path selector MUX1 is connected to the first channel CH1 and the first reference channel RCH1. The first path selector MUX1 connects the first channel CH1 to a first channel path CP1 and the first reference channel RCH1 to a first reference channel path RCP1 in the first connection status, as shown in FIG. 12A. The first path selector MUX1 connects the first channel CH1 to the first reference channel path RCP1 and the first reference channel RCH1 to the first channel path CP1 in the second connection status, as shown in FIG. 12B.

A second path selector MUX2 is connected to the second channel CH2 and the first reference channel RCH11. The second path selector MUX2 connects the second channel CH2 to a second channel path CP2 and the first reference channel RCH1 to the first reference channel path RCP1 in the first connection status, as shown in FIG. 12A. The second path selector MUX2 connects the second channel CH2 to the first reference channel path RCP1 and the first reference channel RCH1 to the second channel path CP2 in the second connection status, as shown in FIG. 12C.

Using the above path selectors MUX1 and MUX2, it can be determined that the error of the memory system 1000 is the error of the channel of the memory apparatus 1200 or the error of the channel path. In the present exemplary embodiment, the error of the memory system 1000 is determined using the reference channels RCH1 to RCH4 having a reliability higher than that of the channels CH1 to CH16.

As shown in FIGS. 12A and 12B, third to sixteenth path selectors MUX3, MUX4, MUX5, MUX6, MUX7, MUX8, MUX9, MUX10, MUX11, MUX12, MUX13, MUX14, MUX15 and MUX16 may be operated in the same way as the first path selector MUX1 and the second path selector MUX2.

According to the present exemplary embodiment, the error of the memory system 1000 is detected in the first connection status and in the second connection status so that it can be determined whether the error of the memory system 1000 is the error of the channel of the memory apparatus 1200 or the error of the channel path. In addition, the error of the memory system 1000 may be determined in a real workload system without transmitting the memory system 1000 to the independent error determining system.

In addition, the memory apparatus 1200 uses the reference channels RCH1 to RCH4 having a higher data reliability than that of the channels CH1 to CH16 so that a reliability of the error determination may be enhanced.

Figure 13:
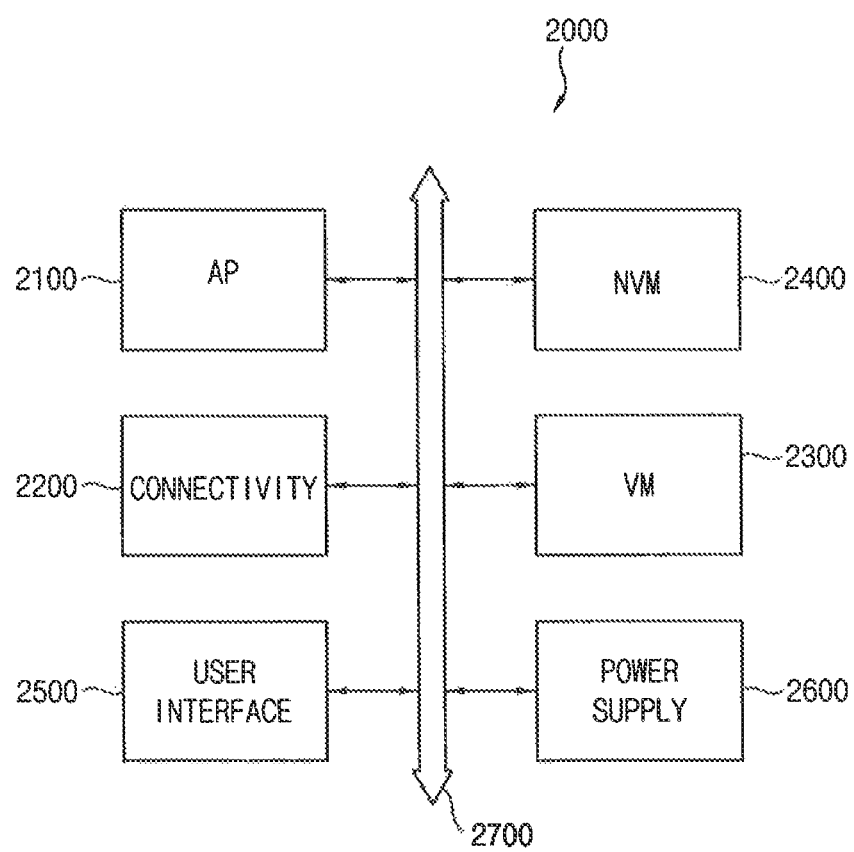
FIG. 13 is a block diagram illustrating an electronic apparatus according to an exemplary embodiment of the present inventive concept including a memory system.

FIG. 13 is a block diagram illustrating an electronic apparatus 2000 according to an exemplary embodiment of the present inventive concept including a memory system.

Referring to FIGS. 1 to 13, the electronic apparatus 2000 includes an application processor 2100, a connectivity circuit 2200, a memory system (VM) 2300, a nonvolatile memory system (NVM) 2400, a user interface 2500, and a power supply 2600 communicating via a bus 2700. For example, the electronic apparatus 2000 may be a mobile apparatus.

The application processor 2100 may execute applications, such as a web browser, a game application, a video player, etc. The connectivity circuit 2200 may perform wired or wireless communication with an external device. The nonvolatile memory system 2400 may store a boot image for booting the electronic apparatus 2000. The user interface 2500 may include at least one input device, such as a keypad, a touch screen, etc., and at least one output device, such as a speaker, a display device, etc. The power supply 2600 may provide a supply voltage to the electronic apparatus 2000. The memory system 2300 may store data processed by the application processor 2100, or may operate as a working memory. As explained above with reference to exemplary embodiments of the present inventive concept, the memory system 2300 may change the connection statuses between the channels and the channel paths in real time to perform an error determination.

The above described embodiments may be used in memory systems, various apparatuses or systems including the memory system, such as a mobile phone, a smart phone, a personal digital assistants (PDA), a portable multimedia player (PMP), a digital camera, a camcorder, a digital television, a set-top box, a music player, a portable game console, a navigation device, a personal computer (PC), a server computer, a workstation, a tablet computer, a laptop computer, a smart card, a printer, a wearable system, an internet of things (IoT) system, a virtual reality (VR) system, an augmented reality (AR) system, etc.

In the memory system, the method of determining the error of the memory system and the electronic apparatus including the memory system, according to exemplary embodiments of the present inventive concept, an error of the memory system is detected in a first connecting status (or connection state) between the channels of the memory apparatus and the channel paths connecting the channels of the memory apparatus to the memory controller, the first connecting status between the channels and the channel paths is changed to a second connecting status (or connection state), and an error of the memory system is detected in the second connecting status between the channels and the channel paths so that it is determined whether the error has occurred in the memory apparatus or in the channel paths.

In addition, the memory system according to an exemplary embodiment of the present inventive concept may not be required to be transmitted to an independent error determining system. The error of the memory system may be determined in a real workload system without transmitting the memory system to the independent error determining system.

While the present inventive concept has been particularly shown and described with reference to exemplary embodiments thereof, it will be apparent to those of ordinary skill in the art that various changes in form and detail may be made therein without departing from the spirit and scope of the present inventive concept as defined by the following claims.

What is claimed is:

1. A memory system, comprising:
a memory apparatus comprising a buffer die, a plurality of core dies disposed on the buffer die, a plurality of channels and a through silicon via configured to transmit a signal between the buffer die and at least one of the core dies;
a memory controller configured to output a command signal and an address signal to the memory apparatus, to output a data signal to the memory apparatus and to receive the data signal from the memory apparatus; and
an interposer comprising a plurality of channel paths for connecting the memory controller and the channels,
wherein the memory apparatus further comprises a path selector for changing a connection state between the channels and channel paths, wherein the path selector includes a multiplexer connected to at least two of the channels and at least two of the channel paths, and
wherein when an error of the memory system is detected in a first connection state between the channels and the channel paths, the path selector changes the first connection state to a second connection state between the channels and the channel paths,
wherein the buffer die is connected to the channel paths,
wherein the buffer die comprises a plurality of buffers, and
wherein the buffers are configured to output the data signal transmitted through at least one of the channel paths to at least one of the channels.

2. The memory system of claim 1, further comprising a package substrate,
wherein the memory apparatus and the memory controller are disposed on the interposer, and
wherein the interposer is disposed on the package substrate.

3. The memory system of claim 1,
wherein the core dies comprise the channels.

4. The memory system of claim 3, wherein the path selector is disposed on the buffer die.

5. The memory system of claim 3, wherein a first core die disposed on the buffer die comprises a first channel and a second channel,
wherein the path selector is configured to connect the first channel to a first channel path and the second channel to a second channel path in the first connection state, and
wherein the path selector is configured to connect the first channel to the second channel path and the second channel to the first channel path in the second connection state.

6. The memory system of claim 3, wherein a first core die disposed on the buffer die comprises a first channel and a second core die disposed on the first core die comprises a second channel,
wherein the path selector is configured to connect the first channel to a first channel path and the second channel to a second channel path in the first connection state, and
wherein the path selector is configured to connect the first channel to the second channel path and the second channel to the first channel path in the second connection state.

7. The memory system of claim 3, wherein a first core die disposed on the buffer die comprises a first channel, a second channel, a third channel and a fourth channel,
wherein the path selector is configured to connect the first channel to a first channel path, the second channel to a second channel path, the third channel to a third channel path and the fourth channel to a fourth channel path in the first connection state, and
wherein the path selector is configured to connect the first channel to the fourth channel path, the second channel to the third channel path, the third channel to the second channel path and the fourth channel to the first channel path in the second connection state.

8. The memory system of claim 3, wherein the path selector is connected to all of the channels of the core dies, and
wherein all connections between the channels and the channel paths in the first connection state are different from all connections between the channels and the channel paths in the second connection state.

9. The memory system of claim 3, wherein the memory apparatus further comprises a reference channel having an error rate less than error rates of the channels, and
wherein the interposer further comprises a reference channel path for connecting the memory controller and the reference channel.

10. The memory system of claim 9, wherein the path selector comprises:
a first path selector connected to a first channel and the reference channel; and
a second path selector connected to a second channel and the reference channel.

11. The memory system of claim 10, wherein the first path selector is configured to connect the first channel to a first channel path and the reference channel to the reference channel path in the first connection state,
wherein the first path selector is configured to connect the first channel to the reference channel path and the reference channel to the first channel path in the second connection state,
wherein the second path selector is configured to connect the second channel to a second channel path and the reference channel to the reference channel path in the first connection state, and
wherein the second path selector is configured to connect the second channel to the reference channel path and the reference channel to the second channel path in the second connection state.

12. A method of determining an error of a memory system, the method comprising:
- detecting an error of the memory system in a first connection state between a plurality of channels of a memory apparatus and a plurality of channel paths connecting the channels to a memory controller, the memory apparatus comprising a buffer die, a plurality of core dies disposed on the buffer die and a through silicon via configured to transmit a signal between at least one of the core dies and the buffer die;
- changing a connection state between the channels and the channel paths from the first connection state to a second connection state when the error of the memory system is detected;
- detecting the error of the memory system in the second connection state; and
- determining that the error of the memory system is an error of a first channel path when a first error is detected at the first channel path connected to a first channel in the first connection state and the first error is detected at the first channel path connected to a second channel in the second connection state.

13. The method of claim 12, further comprising determining that the error of the memory system is an error of the first channel when a second error is detected at the first channel path connected to the first channel in the first connection state and the second error is detected at a second channel path connected to the first channel in the second connection state.

14. The method of claim 12, wherein the buffer die is connected to the channel paths,
- wherein the buffer die comprises a plurality of buffers, wherein the buffers are configured to output a data signal transmitted through at least one of the channel paths to at least one of the channels, and
- wherein the core dies are disposed on the buffer die, wherein the core dies comprise the channels.

15. The method of claim 14, wherein a path selector configured to change the connection state between the channels and the channel paths is disposed on the buffer die.

16. The method of claim 15, wherein a first core die disposed on the buffer die comprises a first channel and a second channel,
- wherein the path selector is configured to connect the first channel to a first channel path and the second channel to a second channel path in the first connection state, and
- wherein the path selector is configured to connect the first channel to the second channel path and the second channel to the first channel path in the second connection state.

17. The method of claim 15, wherein a first core die disposed on the buffer die comprises a first channel and a second core die disposed on the first core die comprises a second channel,
- wherein the path selector is configured to connect the first channel to a first channel path and the second channel to a second channel path in the first connection state, and
- wherein the path selector is configured to connect the first channel to the second channel path and the second channel to the first channel path in the second connection state.

18. The method of claim 15, wherein the memory apparatus further comprises a reference channel having an error rate less than error rates of the channels,
- wherein the path selector comprises:
  - a first path selector connected to a first channel and the reference channel; and
  - a second path selector connected to a second channel and the reference channel,
- wherein the first path selector is configured to connect the first channel to a first channel path and the reference channel to a reference channel path in the first connection state,
- wherein the first path selector is configured to connect the first channel to the reference channel path and the reference channel to the first channel path in the second connection state,
- wherein the second path selector is configured to connect the second channel to a second channel path and the reference channel to the reference channel path in the first connection state, and
- wherein the second path selector is configured to connect the second channel to the reference channel path and the reference channel to the second channel path in the second connection state.

19. An electronic apparatus, comprising:
- an application processor; and
- a memory system configured to be operated by the application processor,
- wherein the memory system comprises:
- a memory apparatus comprising a buffer die, a plurality of core dies disposed on the buffer die, a plurality of channels and a through silicon via configured to transmit a signal between at least one of the core dies and the buffer die;
- a memory controller configured to output a command signal and an address signal to the memory apparatus, to output a data signal to the memory apparatus and to receive the data signal from the memory apparatus; and
- an interposer comprising a plurality of channel paths for connecting the memory controller and the channels,
- wherein the memory apparatus further comprises a path selector for changing a connection state between the channels and channel paths,
- wherein when an error of the memory system is detected in a first connection state between the channels and the channel paths, the path selector changes from the first connection state to a second connection state,
- wherein the buffer die is connected to the channel paths,
- wherein the buffer die comprises a plurality of buffers, and
- wherein the buffers are configured to output the data signal transmitted through at least one of the channel paths to at least one of the channels.

* * * * *